(12) United States Patent
Misaki et al.

(10) Patent No.: US 9,368,523 B2
(45) Date of Patent: Jun. 14, 2016

(54) SEMICONDUCTOR DEVICE, METHOD FOR MANUFACTURING SEMICONDUCTOR DEVICE, AND DISPLAY DEVICE

(71) Applicant: Sharp Kabushiki Kaisha, Osaka-shi, Osaka (JP)

(72) Inventors: Katsunori Misaki, Yonago (JP); Kunio Matsubara, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 14/387,949

(22) PCT Filed: Mar. 11, 2013

(86) PCT No.: PCT/JP2013/056665
§ 371 (c)(1),
(2) Date: Sep. 25, 2014

(87) PCT Pub. No.: WO2013/146216
PCT Pub. Date: Oct. 3, 2013

(65) Prior Publication Data
US 2015/0053968 A1   Feb. 26, 2015

(30) Foreign Application Priority Data
Mar. 27, 2012   (JP) ................................. 2012-071511

(51) Int. Cl.
*H01L 27/12* (2006.01)
*G02F 1/1362* (2006.01)
*H01L 29/66* (2006.01)
*H01L 29/786* (2006.01)
*G02F 1/1368* (2006.01)

(52) U.S. Cl.
CPC ...... *H01L 27/1248* (2013.01); *G02F 1/136227* (2013.01); *H01L 27/124* (2013.01);
(Continued)

(58) Field of Classification Search
CPC .............. H01L 27/1248; H01L 27/124; H01L 27/1255; H01L 29/7869; G02F 1/136213
See application file for complete search history.

(56) References Cited

U.S. PATENT DOCUMENTS

| 7,038,740 B1 | 5/2006 | Katsuya |
| 2006/0138461 A1 | 6/2006 | Abe et al. |

(Continued)

FOREIGN PATENT DOCUMENTS

| JP | 2001-033818 A | 2/2001 |
| JP | 2011-053443 A | 3/2011 |
| JP | 2011-191764 A | 9/2011 |
| JP | 2012-134475 A | 7/2012 |
| WO | 2005/029450 A1 | 3/2005 |
| WO | 2011/055474 A1 | 5/2011 |

OTHER PUBLICATIONS

Official Communication issued in International Patent Application No. PCT/JP2013/056665, mailed on Apr. 9, 2013.

*Primary Examiner* — Tucker J Wright
(74) *Attorney, Agent, or Firm* — Keating & Bennett, LLP

(57) ABSTRACT

This semiconductor device (1000A) includes a TFT (100A) with an oxide semiconductor layer 9, a storage capacitor line (12), and a first transparent electrode (15) electrically connected to the storage capacitor line (12). The first transparent electrode (15) includes a portion which overlaps with a first connecting layer (8x) when viewed along a normal to a substrate (1). The portion that overlaps with the first connecting layer (8x) has a point symmetric shape of which a point of symmetry is located inside a contact hole (CH2) when viewed along a normal to the substrate (1). The first transparent electrode (15) is not in direct contact with the first connecting layer (8x). A portion of the first transparent electrode (15) is in direct contact with a second connecting layer (8x). The first connecting layer (8x) is in direct contact with the second connecting layer (19a). And the first transparent electrode (15) is electrically connected to the storage capacitor line (12) via the first and second connecting layers (8x, 19a).

12 Claims, 20 Drawing Sheets

(52) U.S. Cl.
CPC ........ *H01L27/1225* (2013.01); *H01L 27/1255* (2013.01); *H01L 29/66969* (2013.01); *H01L 29/7869* (2013.01); *H01L 29/78606* (2013.01); *G02F 1/1368* (2013.01); *G02F 2001/136272* (2013.01)

(56) References Cited

U.S. PATENT DOCUMENTS

| | | |
|---|---|---|
| 2011/0050551 A1 | 3/2011 | Ota et al. |
| 2011/0227063 A1 | 9/2011 | Yun et al. |
| 2012/0138922 A1 | 6/2012 | Yamazaki et al. |
| 2012/0218485 A1 | 8/2012 | Chikama et al. |

FIG.20
(a)
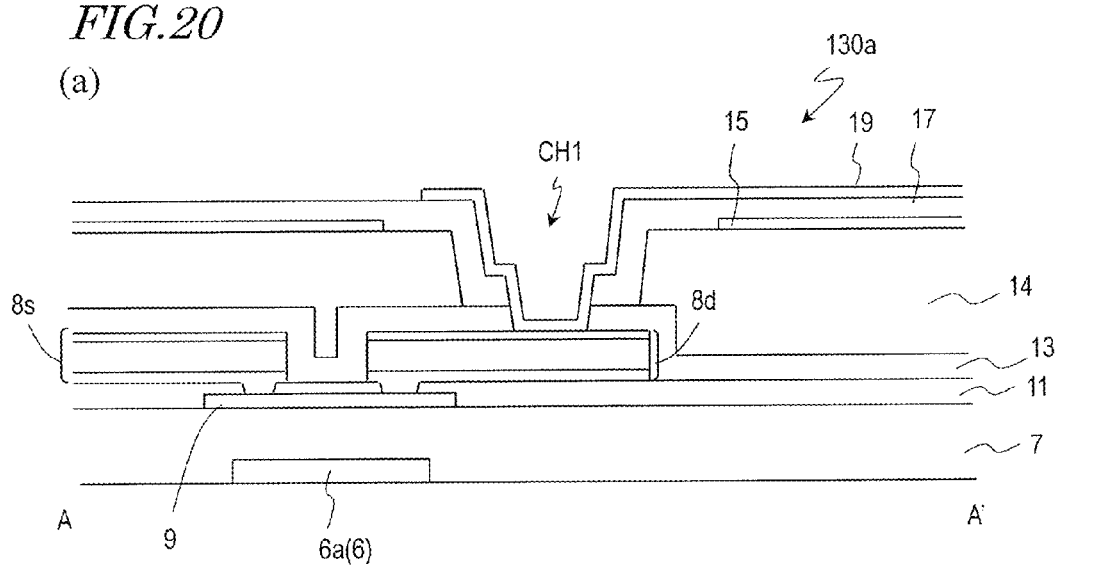
(b)
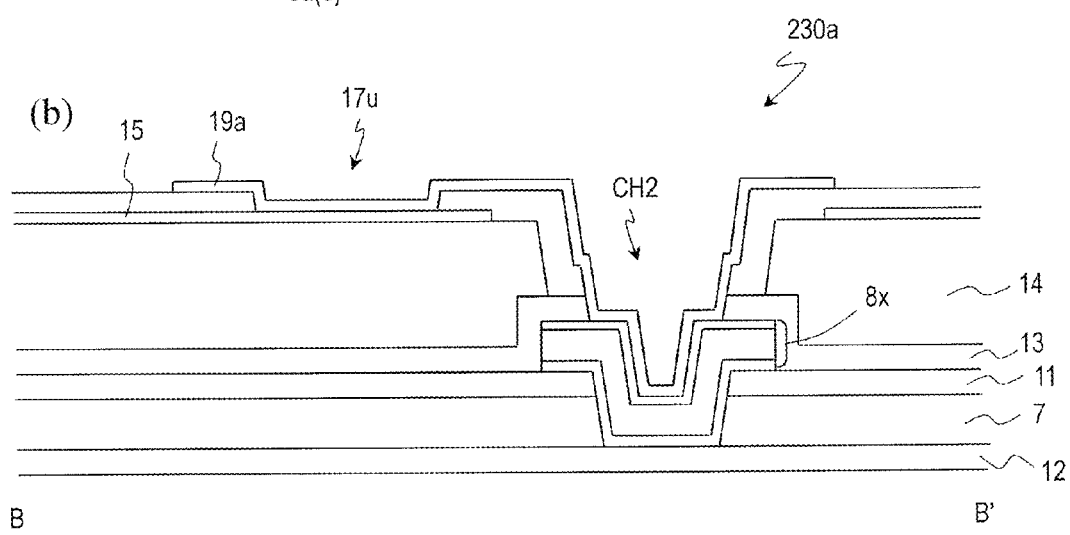

FIG.22
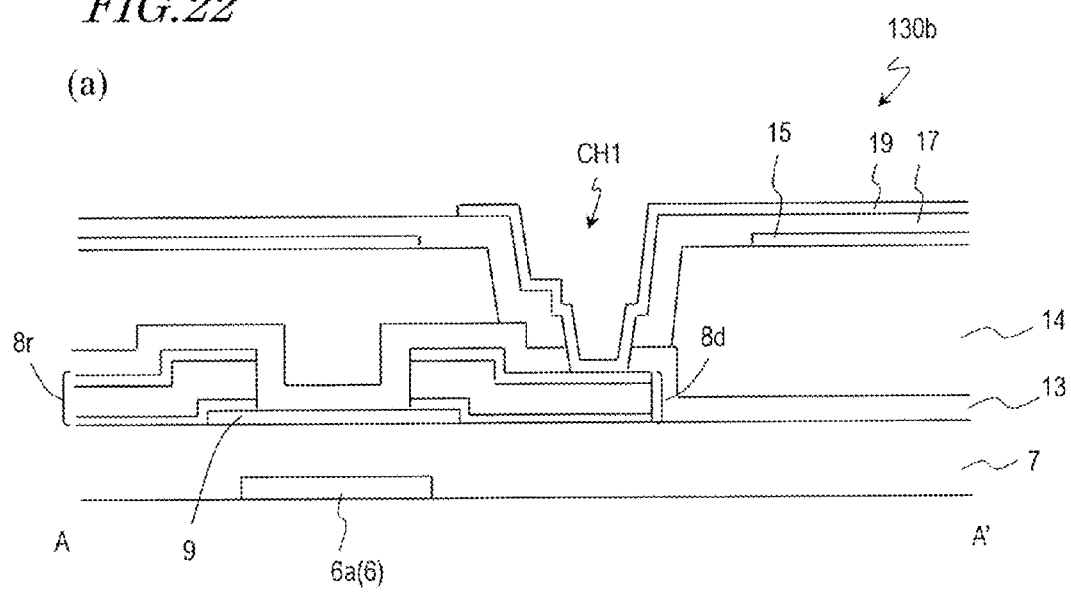
(a)
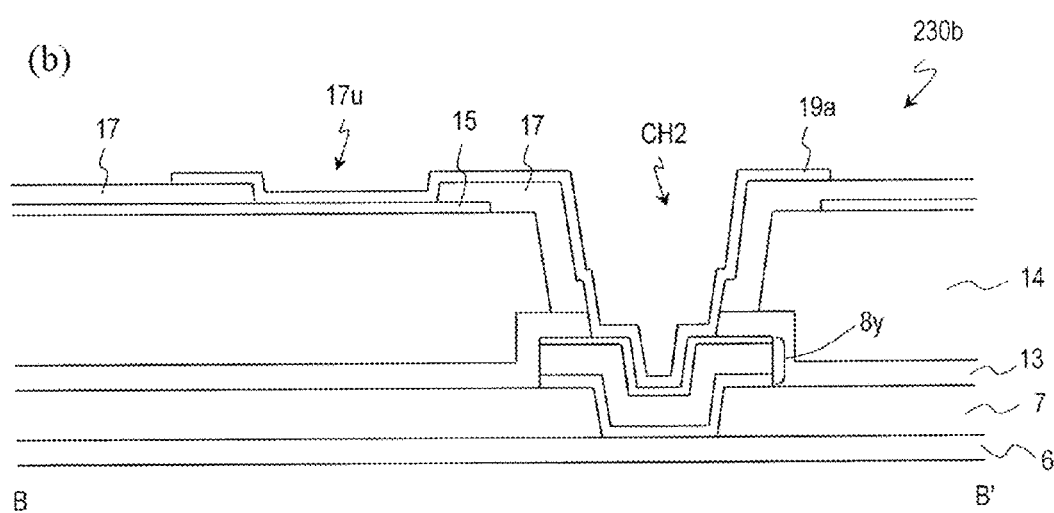
(b)

SEMICONDUCTOR DEVICE, METHOD FOR MANUFACTURING SEMICONDUCTOR DEVICE, AND DISPLAY DEVICE

TECHNICAL FIELD

The present invention relates to a semiconductor device including a thin-film transistor and a method for fabricating such a semiconductor device, and also relates to a display device.

BACKGROUND ART

An active-matrix-addressed liquid crystal display device generally includes a substrate on which thin-film transistors (which will also be referred to herein as "TFTs") are provided as switching elements for respective pixels (such a substrate will be referred to herein as a "TFT substrate"), a counter substrate on which color filters and other members are arranged, and a liquid crystal layer which is interposed between the TFT substrate and the counter substrate. The TFT substrate further includes storage capacitors along with the TFTs. Each of those storage capacitors is a capacitance which is arranged, in order to maintain the voltage applied to the liquid crystal layer of a pixel (which is called electrically a "liquid crystal capacitor"), electrically in parallel with the liquid crystal capacitor. In this description, a TFT substrate and a display device including a TFT substrate will be sometimes referred to herein as "semiconductor devices".

Patent Document No. 1 discloses a liquid crystal display device including a storage capacitor with a transparent storage capacitor electrode (which will be sometimes referred to herein as a "transparent storage capacitor"). A liquid crystal display device with such a storage capacitor can use incoming light highly efficiently and can obtain sufficient storage capacitance without causing a decrease in the aperture ratio of the pixel. Thus, it is said that such a liquid crystal display device is applicable to making a liquid crystal display device which has had significantly increased definition.

Recently, people have proposed that an oxide semiconductor be used as a material for the active layer of a TFT instead of a silicon semiconductor. Such a TFT will be referred to herein as an "oxide semiconductor TFT". Since an oxide semiconductor has higher mobility than amorphous silicon, the oxide semiconductor TFT can operate at higher speeds than an amorphous silicon TFT. For example, Patent Document No. 2 discloses an active-matrix-addressed liquid crystal display device which uses an oxide semiconductor TFT as a switching element (see Patent Document No. 2, for example). Also, the oxide semiconductor TFT disclosed in Patent Document No. 2 includes an etch stop layer over an oxide semiconductor layer in order to protect the channel region of the oxide semiconductor layer.

CITATION LIST

Patent Literature

Patent Document No. 1: Japanese Laid-Open Patent Publication No. 2001-33818
Patent Document No. 2: Japanese Laid-Open Patent Publication No. 2011-191764

SUMMARY OF INVENTION

Technical Problem

The present inventors discovered that if the transparent storage capacitor was adopted for a semiconductor device, then the problem to be described below would arise.

In a transparent storage capacitor including a transparent storage capacitor electrode, the transparent storage capacitor electrode is electrically connected to a storage capacitor line which supplies a signal to the transparent storage capacitor electrode. The transparent storage capacitor electrode and the storage capacitor line are located in mutually different layers, and there is an insulating layer between the transparent storage capacitor electrode and the storage capacitor line. Thus, the transparent storage capacitor electrode is electrically connected to the storage capacitor line via a contact hole which is formed in the insulating layer that is interposed between the transparent storage capacitor electrode and the storage capacitor line. Or in some cases, a conductive connecting layer may be arranged over the storage capacitor line so as to overlap with the contact hole, and the storage capacitor line and the transparent storage capacitor electrode may be electrically connected together through the connecting layer.

In this case, in a situation where the insulating layer between the transparent storage capacitor electrode and the storage capacitor line has a multilayer structure including two or more layers, if either a contact hole (opening) or a connecting layer to electrically connect the storage capacitor line and the transparent storage capacitor electrode together is provided in view of an alignment margin or any other consideration, then the area of the contact hole or the connecting layer would be too large to avoid causing a decrease in the aperture ratio of the pixel, which is a problem. Particularly when an etch stop layer as disclosed in Patent Document No. 2 is provided on the TFT substrate, this problem will be a serious one.

The present inventors perfected an embodiment of our invention in order to overcome these problems by providing a semiconductor device including a storage capacitor which will cause much less decrease in the aperture ratio of a pixel, a method for fabricating such a semiconductor device, and a display device including such a semiconductor device.

Solution to Problem

A semiconductor device according to an embodiment of the present invention includes a substrate and a thin-film transistor formed on the substrate. The thin-film transistor includes: a gate electrode; a gate insulating layer formed over the gate electrode; an oxide semiconductor layer formed on the gate insulating layer; and source and drain electrodes electrically connected to the oxide semiconductor layer. The semiconductor device further includes: an interlayer insulating layer including a protective layer which contacts with the source and drain electrodes; a first transparent electrode formed on the interlayer insulating layer; a dielectric layer formed over the first transparent electrode; a second transparent electrode arranged on the dielectric layer so as to overlap with at least a portion of the first transparent electrode with the dielectric layer interposed between them; a storage capacitor line formed out of the same conductive film as the gate electrode; a first connecting layer which is electrically connected to the storage capacitor line and which is formed out of the same conductive film as the source or drain electrode; and a second connecting layer which is formed out of the same conductive film as, but which is not electrically connected to, the second transparent electrode. An insulating layer interposed between the first and second connecting layers has a contact hole to electrically connect the second connecting layer to the first transparent electrode and the first connecting layer. When viewed along a normal to the substrate, the second connecting layer and the contact hole overlap at least partially with the first connecting layer. The first transparent electrode includes a portion which overlaps with the first connecting layer when viewed along a normal to the substrate. The portion which overlaps with the first connecting layer has a point symmetric shape of which a point of symmetry is located inside the contact hole when viewed along a normal to the substrate. The first transparent electrode is not in direct contact with the first connecting layer. A portion of the first transparent electrode is in direct contact with the second connecting layer. The first connecting layer is in direct contact with the second connecting layer. And the first transparent electrode is electrically connected to the storage capacitor line via the first and second connecting layers.

In one embodiment, the second connecting layer covers at least partially the side surface of the contact hole.

In one embodiment, in a first cross section which intersects with the substrate at right angles and which includes the point of symmetry, a portion of the first transparent electrode is in contact with the second connecting layer. And in a second cross section which intersects with the substrate at right angles, which includes the point of symmetry and which is different from the first cross section, the first transparent electrode is out of contact with the second connecting layer.

In one embodiment, the contact hole includes a first hole formed in the protective layer and a second hole formed in the dielectric layer, and the side surface of the second hole is at least partially aligned with the side surface of the first hole.

In one embodiment, the interlayer insulating layer further includes an organic insulating layer, which has a third hole that overlaps with the first connecting layer when viewed along a normal to the substrate. The first and second holes are located at least partially inside the third hole.

In one embodiment, the first transparent electrode covers a side surface of the third hole at least partially.

In one embodiment, the semiconductor device further includes an etch stop layer formed so as to cover a channel region of the oxide semiconductor layer. The gate insulating layer is formed over the storage capacitor line. The etch stop layer is formed over the gate insulating layer. The gate insulating layer and the etch stop layer have a fourth hole which overlaps with the storage capacitor line when viewed along a normal to the substrate. Inside the fourth hole, a side surface of the gate insulating layer is aligned at least partially with a side surface of the etch stop layer. And the first connecting layer covers the respective side surfaces of the gate insulating layer and the etch stop layer at least partially inside the fourth hole.

In one embodiment, the semiconductor device further includes a gate terminal portion formed on the substrate. The gate terminal portion includes: a gate terminal connecting layer formed out of the same conductive film as the gate electrode; and a third connecting layer which is electrically connected to the gate terminal connecting layer and which is formed out of the same conductive film as the source or drain electrode. The gate insulating layer is formed over the gate terminal connecting layer. The gate insulating layer and the etch stop layer have a fifth hole which overlaps with the gate terminal connecting layer when viewed along a normal to the substrate. And the third connecting layer covers at least partially a side surface of the fifth hole.

In one embodiment, the oxide semiconductor layer includes an In—Ga—Zn—O based semiconductor.

A display device according to an embodiment of the present invention includes: a semiconductor device according to any of the embodiments described above; a counter substrate which is arranged to face the semiconductor device and which includes at least a blue color filter; a liquid crystal layer interposed between the counter substrate and the semiconductor device; and a plurality of pixels. The second transparent electrode is divided into a plurality of portions which are provided for the respective pixels and which function as pixel electrodes. And the storage capacitor line is arranged so as to face the blue color filter.

In one embodiment, the second transparent electrode has a plurality of slit holes inside the pixels, and the first transparent electrode is present at least under the plurality of holes and functions as a common electrode.

A semiconductor device fabricating method according to an embodiment of the present invention is a method for fabricating a semiconductor device including a thin-film transistor, and includes the steps of: (A) forming a gate electrode and a storage capacitor line on a substrate; (B) forming a gate insulating layer over the gate electrode and the storage capacitor line; (C) forming an oxide semiconductor layer on the gate insulating layer so that the oxide semiconductor layer overlaps with the gate electrode when viewed along a normal to the substrate; (D) forming an insulating film over the oxide semiconductor layer and the gate insulating layer and etching a portion of the gate insulating layer and the insulating film, thereby forming an etch stop layer which has a first hole that overlaps with the storage capacitor line when viewed along a normal to the substrate and a second hole that exposes the oxide semiconductor layer partially; and (E) forming a source electrode, a drain electrode and a first connecting layer out of the same conductive film. The first connecting layer is electrically connected to the storage capacitor line and formed so as to cover a side surface of the first hole at least partially, and the source and drain electrodes are electrically connected to the oxide semiconductor layer inside the second hole.

In one embodiment, the semiconductor device fabricating method further includes the steps of: (F) forming a protective layer over the source and drain electrodes; (G) forming an organic insulating layer over the protective layer so that the organic insulating layer has a third hole which overlaps with the storage capacitor line when viewed along a normal to the substrate; (H) forming a first transparent electrode on the organic insulating layer so that the first transparent electrode covers a side surface of the third hole at least partially; and (I) forming a dielectric film over the first transparent electrode and etching the dielectric film and the protective layer simultaneously, thereby forming a dielectric layer with a fourth hole which exposes the first connecting layer partially.

In one embodiment, the semiconductor device fabricating method further includes the step (J) of forming a second transparent electrode and a second connecting layer, which is not electrically connected to the second transparent electrode, on the dielectric layer. The second connecting layer is electrically connected to the first transparent electrode and the first connecting layer inside the fourth hole and covers a side surface of the fourth hole at least partially.

In one embodiment, the oxide semiconductor layer includes an In—Ga—Zn—O based semiconductor.

Advantageous Effects of Invention

An embodiment of the present invention provides a semiconductor device including a storage capacitor which will cause much less decrease in the aperture ratio of a pixel, a method for fabricating such a semiconductor device, and a display device including such a semiconductor device.

BRIEF DESCRIPTION OF DRAWINGS

FIG. 20 (a) is a schematic cross-sectional view of a TFT 130a as viewed on the plane A-A' shown in FIG. 19, and (b) is a schematic cross-sectional view of a storage capacitor connecting portion 230a as viewed on the plane B-B' shown in FIG. 19.

FIG. 22 (a) is a schematic cross-sectional view of a TFT 130b as viewed on the plane A-A' shown in FIG. 21, and (b) is a schematic cross-sectional view of a storage capacitor connecting portion 230b as viewed on the plane B-B' shown in FIG. 21.

DESCRIPTION OF EMBODIMENTS

Hereinafter, embodiments of a semiconductor device, method for fabricating the semiconductor device, and display device according to the present invention will be described with reference to the accompanying drawings. It should be noted, however, that the present invention is in no way limited to the illustrative embodiments to be described below.

An embodiment of a semiconductor device according to the present invention is a TFT substrate for use in an active-matrix-addressed liquid crystal display device. However, a semiconductor device according to this embodiment does not have to be a TFT substrate for use in a liquid crystal display device but may also be a TFT substrate for use in any of various other kinds of display devices and electronic devices.

Figure 1:
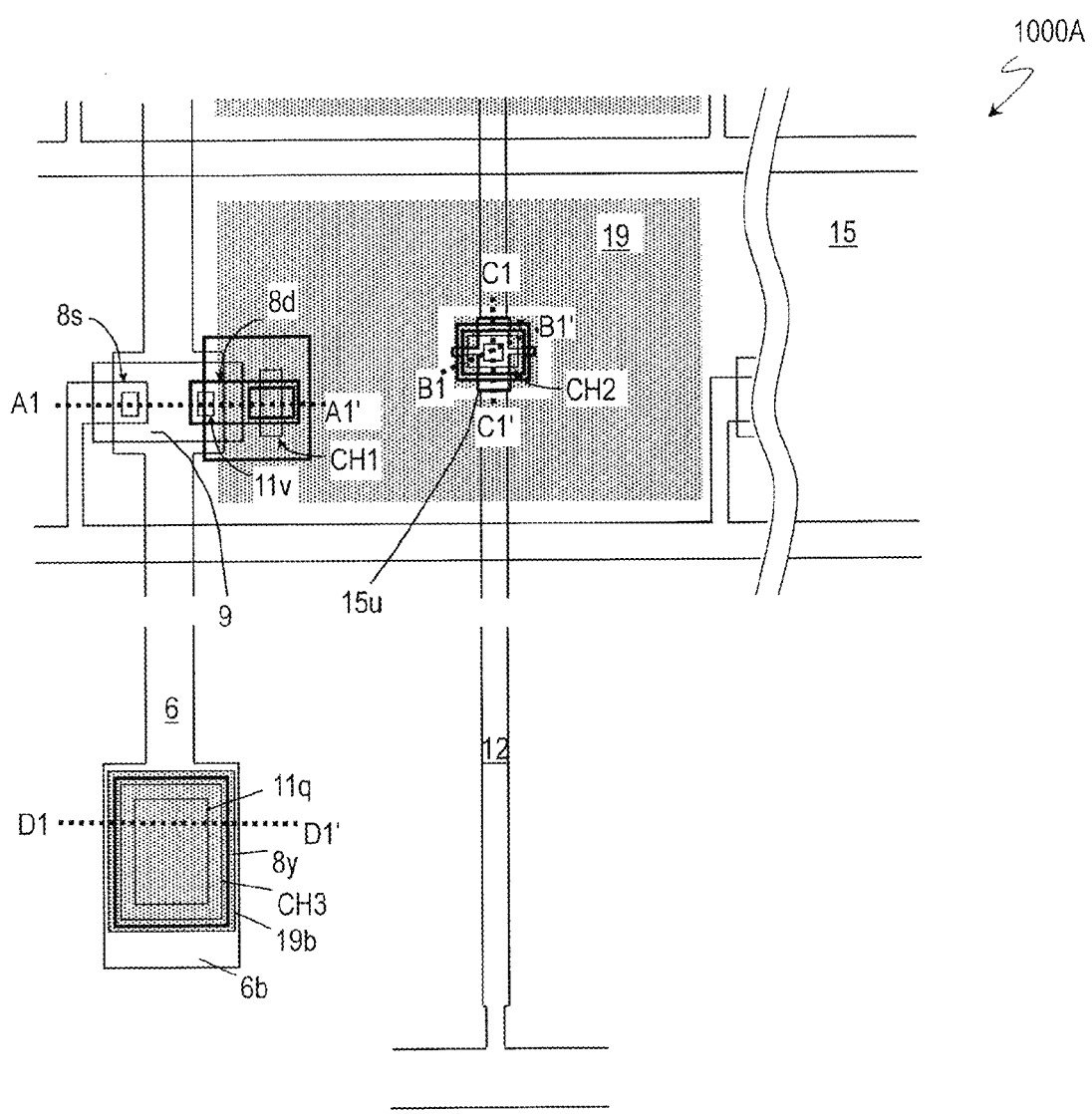
FIG. 1 A schematic plan view of a semiconductor device (TFT substrate) 1000A as an embodiment of the present invention.

FIG. 1 schematically illustrates a planar structure of a semiconductor device (TFT substrate 1000A) as an embodiment of the present invention. FIG. 2(a) is a schematic cross-sectional view of a TFT 100A as viewed on the plane A1-A1' shown in FIG. 1. FIGS. 2(b) and 2(c) are schematic cross-sectional views of a storage capacitor connecting portion 200A as respectively viewed on the planes B1-B1' and C1-C1' shown in FIG. 1. And FIG. 2(d) is a schematic cross-sectional view of a gate terminal portion 300A as viewed on the plane D1-D1' shown in FIG. 1.

As shown in FIG. 1 and FIGS. 2(a) through 2(d), this semiconductor device (TFT substrate) 1000A includes a substrate 1 and a thin-film transistor (TFT) 100A formed on the substrate 1. The TFT 100A includes: a gate electrode 6a; a gate insulating layer 7 formed over the gate electrode 6a; an oxide semiconductor layer 9 formed on the gate insulating layer 7; and source and drain electrodes 8s, 8d which are electrically connected to the oxide semiconductor layer 9. In this description, the "gate electrode" refers herein to an electrode which overlaps with the oxide semiconductor layer 9 when viewed along a normal to the substrate 1 and which controls the conductive property of the oxide semiconductor layer 9. Although an etch stop layer 11 has been formed in this TFT 100A so as to cover the channel region of the oxide semiconductor layer 9, the etch stop layer 11 may be sometimes omitted as will be described later.

The TFT substrate 1000A further includes: an interlayer insulating layer 23 including a protective layer 13 which contacts with the source and drain electrodes 8s, 8d; a first transparent electrode 15 which is formed on the interlayer insulating layer 23; a dielectric layer 17 which is formed over the first transparent electrode 15; and a second transparent electrode 19 which is arranged on the dielectric layer 17 so as to overlap with at least a portion of the first transparent electrode 15 with the dielectric layer 17 interposed between them. In this embodiment, at least a portion of the second transparent electrode 19 is arranged so as to overlap with the first transparent electrode 15 with the dielectric layer 17 interposed between them, thus forming a capacitor between them. This capacitor functions as a storage capacitor.

The TFT substrate 1000A further includes: a storage capacitor line 12 which is formed out of the same conductive film as the gate electrode 6a; a first connecting layer 8x which is electrically connected to the storage capacitor line 12 and which is formed out of the same conductive film as the source or drain electrode 8s, 8d; and a second connecting layer 19a which is formed out of the same conductive film as, but which is not electrically connected to, the second transparent electrode 19. An insulating layer (e.g., the protective layer 13) interposed between the first and second connecting layers 8x and 19a has a contact hole CH2 to electrically connect the second connecting layer 19a to the first transparent electrode 15 and the first connecting layer 8x. The insulating layer interposed between the first and second connecting layers 8x and 19a may have a single-layer structure or a multilayer structure consisting of two or more layers, for example, and may be made of an inorganic material (such as SiNx), an organic material (such as a transparent resin), or a combination of inorganic and organic materials.

When viewed along a normal to the substrate 1, the second connecting layer 19a and the contact hole CH2 overlap at least partially with the first connecting layer 8x. The first transparent electrode 15 includes a portion which overlaps with the first connecting layer 8x when viewed along a normal to the substrate 1. That portion which overlaps with the first connecting layer 8x has a symmetric shape of which the point of symmetry is located inside the contact hole CH2 when viewed along a normal to the substrate 1. The first transparent electrode 15 is not in direct contact with the first connecting layer 8x. A portion of the first transparent electrode 15 is in direct contact with the second connecting layer 19a. The first connecting layer 8x is in direct contact with the second connecting layer 19a. And the first transparent electrode 15 is electrically connected to the storage capacitor line 12 via the first and second connecting layers 8x and 19a. Thus, a signal supplied to the storage capacitor line 12 is transferred from the storage capacitor line 12 to the first connecting layer 8x, from the first connecting layer 8x to the second connecting layer 19a, and then from the second connecting layer 19a to the first transparent electrode 15.

In the TFT substrate 1000A with such a configuration, the size of the contact hole can be determined without taking misalignment and other errors into consideration, and therefore, the contact hole can have a smaller size and a decrease in the aperture ratio of the pixel can be minimized. In addition, since the portion of the first transparent electrode 15 that overlaps with the first connecting layer 8x has a symmetric shape, the area of contact between the first and second transparent electrodes 15 and 19 does not change even if misalignment has occurred. It should be noted that the portion of the first transparent electrode 15 that overlaps with the first connecting layer 8x may not have a symmetric shape depending on the process condition. In that case, if a portion of a photomask pattern corresponding to that portion of the first transparent electrode 15 that overlaps with the first connecting layer 8x has a symmetric shape, it can be said the "portion of the first transparent electrode 15 that overlaps with the first connecting layer 8x has a symmetric shape". Furthermore, since the sizes of the first and second connecting layers 8x and 19a and the contact hole CH2 can be determined without taking misalignment into consideration, the first and second connecting layers 8x and 19a and the contact hole CH2 can have as small sizes as possible and a decrease in the aperture ratio of the pixel can be minimized.

The second connecting layer 19a suitably covers the side surface of the contact hole CH2 at least partially.

Figure 2:
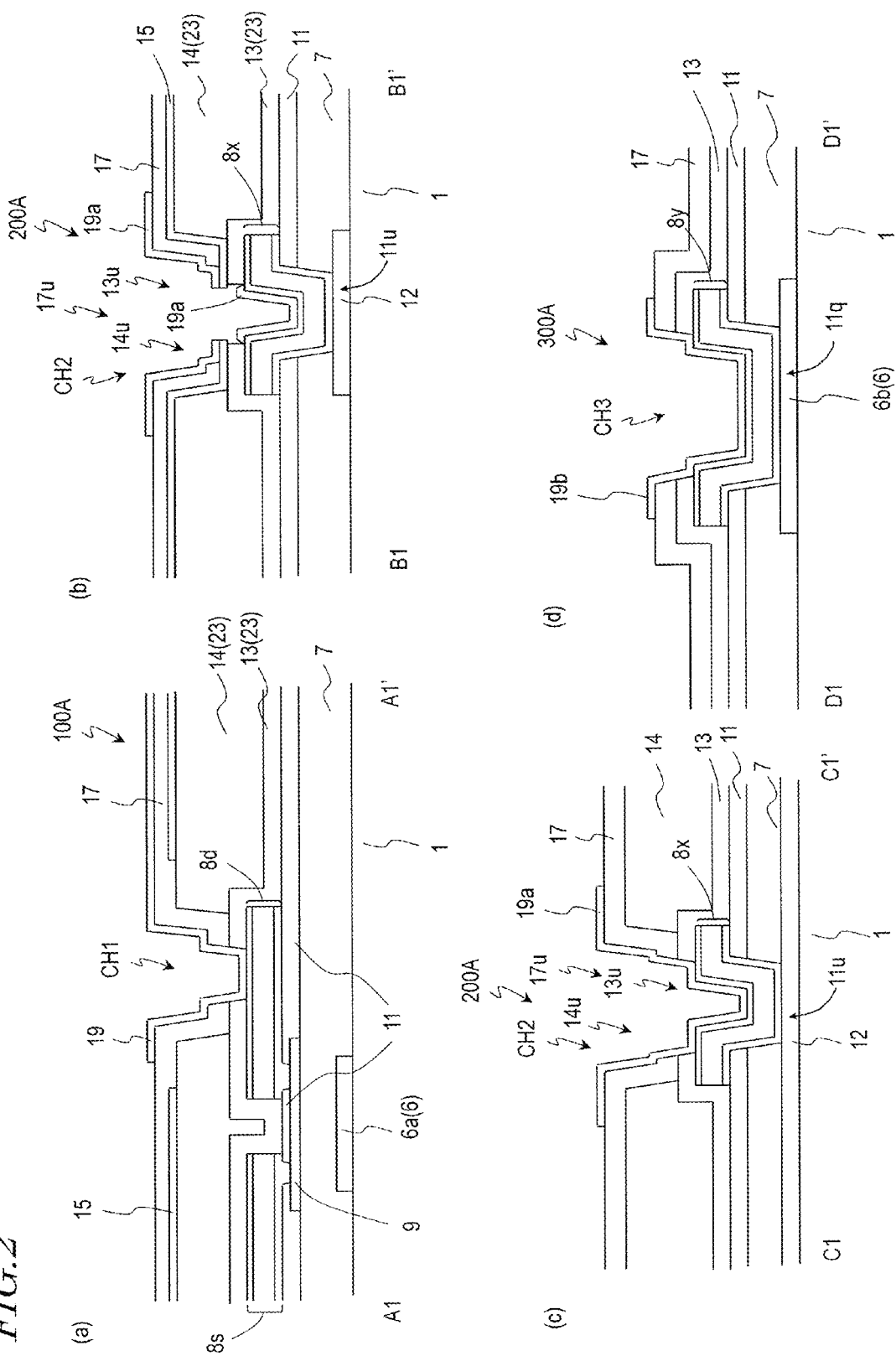
FIG. 2 (a) is a schematic cross-sectional view of a TFT 100A as viewed on the plane A1-A1' shown in FIG. 1, (b) is a schematic cross-sectional view of a storage capacitor connecting portion 200A as viewed on the plane B1-B1' shown in FIG. 1, (c) is a schematic cross-sectional view of the storage capacitor connecting portion 200A as viewed on the plane C1-C1' shown in FIG. 1, and (d) is a schematic cross-sectional view of a gate terminal portion 300A as viewed on the plane D1-D1' shown in FIG. 1.

Furthermore, as shown in FIGS. 1 and 2, in a first cross section which intersects with the substrate 1 at right angles and which includes the point of symmetry of the portion of the first transparent electrode 15 that overlaps with the first connecting layer 8x (e.g., the plane B-B' shown in FIG. 2(b)), a portion of the first transparent electrode 15 is suitably formed to contact with the second connecting layer 19a. In a second cross section which intersects with the substrate 1 at right angles, which includes the point of symmetry of the portion of the first transparent electrode 15 that overlaps with the first connecting layer 8x and which is different from the first cross section (e.g., the plane C-C' shown in FIG. 2(c)), the first transparent electrode 15 is suitably formed not to contact with the second connecting layer 19a. In this embodiment, the first transparent electrode 15 has a hole 15u which overlaps with the first connecting layer 8x when viewed along a normal to the substrate 1.

In this embodiment, the contact hole CH2 includes a hole 13u which is formed in the protective layer 13 and a hole 17u which is formed in the dielectric layer 17. The side surface of the hole 17u is at least partially aligned with the side surface of the hole 13u.

In this embodiment, the interlayer insulating layer 23 further includes an organic insulating layer 14, which has a hole 14u that overlaps with the first connecting layer 8x when viewed along a normal to the substrate 1. The holes 13u and 17u are suitably located at least partially inside the hole 14u. Also, the first transparent electrode 15 suitably covers the side surface of the hole 14u at least partially.

As described above, the TFT 100A further includes an etch stop layer 11 formed so as to cover a channel region of the oxide semiconductor layer 9. The gate insulating layer 7 has been formed over the storage capacitor line 12. The etch stop layer 11 has been formed over the gate insulating layer 7. The gate insulating layer 7 and the etch stop layer 11 have a hole 11u which overlaps with the storage capacitor line 12 when viewed along a normal to the substrate 1. Inside the hole 11u, the side surface of the gate insulating layer 7 is suitably aligned at least partially with the side surface of the etch stop layer 11. And the first connecting layer 8x suitably covers the respective side surfaces of the gate insulating layer 7 and the etch stop layer 11 at least partially inside the hole 11u.

If the first connecting layer 8x is provided inside the hole 11u, the contact hole CH2 which electrically connects the second connecting layer 19a and the storage capacitor line 12 together can have its depth reduced, and therefore, the second connecting layer 19a is less likely to get disconnected. In addition, it is possible to prevent the storage capacitor line 12 from being etched and disconnected while the source and drain electrodes 8s and 8d are being formed.

As will be described in detail later, this TFT substrate 1000A can be fabricated by a simplified manufacturing process, and therefore, its manufacturing cost can be cut down. In addition, since the portion of the first transparent electrode 15 that overlaps with the first connecting layer 8x has a symmetric shape, the area of contact between the first and second transparent electrodes 15 and 19 does not change even if misalignment has occurred. Furthermore, since the sizes of the first and second connecting layers 8x and 19a and the contact hole CH2 can be determined without taking misalignment into consideration, the first and second connecting layers 8x and 19a and the contact hole CH2 can have as small sizes as possible and a decrease in the aperture ratio of the pixel can be minimized.

The TFT substrate 1000A further includes a gate terminal portion 300A formed on the substrate 1. The gate terminal portion 300A includes: a gate terminal connecting layer 6b which is formed out of the same conductive film as the gate electrode 6a; and a third connecting layer 8y which is electrically connected to the gate terminal connecting layer 6b and which is formed out of the same conductive film as the source or drain electrode 8s or 8d. The gate terminal connecting layer 6b has been formed out of the same film as the gate line 6 (to be described later) and is electrically connected to the gate line 6. The gate insulating layer 7 has been formed over the gate line 6. The gate insulating layer 6 and the etch stop layer 11 have a hole 11q which overlaps with the gate terminal connecting layer 6b when viewed along a normal to the substrate 1. The third connecting layer 8y suitably covers the side surface of the hole 11q at least partially.

Hereinafter, the TFT substrate 1000A will be described in detail.

The TFT substrate 1000A includes TFTs 100A and storage capacitor connecting portions 200A which are provided for the respective pixels and a gate terminal portion 300A which is arranged substantially on the outer periphery of the substrate 1. The TFT substrate 1000A further includes a plurality of gate lines 6 and a plurality of storage capacitor lines 12 which are arranged in columns and a plurality of source lines which are arranged in rows.

As shown in FIGS. 1 and 2(a), an interlayer insulating layer 23 has been formed over the TFT 100A, a first transparent electrode (common electrode) 15 has been formed on the interlayer insulating layer 23, a dielectric layer 17 has been formed over the first transparent electrode 15, and a second transparent electrode (pixel electrode) 19 has been formed on the dielectric layer 17. The interlayer insulating layer 23 includes a protective layer 13 and an organic insulating layer 14. The second transparent electrode 19 is electrically connected to a drain electrode 8d inside a contact hole CH1 which is formed in the interlayer insulating layer 23. In this TFT substrate 1000A, the second transparent electrode 19 has a plurality of slit holes (not shown) inside the pixels, and the first transparent electrode 15 is present at least under the plurality of slit holes (not shown) and functions as a common electrode. Also, inside the hole 11v of an etch stop layer 11 which is formed over the oxide semiconductor layer 9, the source and drain electrodes 8s and 8d are in contact with the oxide semiconductor layer 9.

As shown in FIGS. 1 and 2(d), in the gate terminal portion 300A, a protective layer 13 has been formed on a third connecting layer 8y, and a dielectric layer 17 has been formed on the protective layer 13. In addition, a contact hole CH3 which overlaps with the third connecting layer 8y when viewed along a normal to the substrate 1 has been cut through the protective layer 13 and the dielectric layer 17. Furthermore, a transparent electrode 19b which is formed out of the same conductive film as the second transparent electrode 19 has been formed on the dielectric layer 17. The transparent electrode 19b is electrically connected to the third connecting layer 8y inside the contact hole CH3.

The gate line 6, gate electrode 6a, gate terminal connecting layer 6b and storage capacitor line 12 may each have a multilayer structure, of which the upper layer is a W (tungsten) layer and the lower layer is a TaN (tantalum nitride) layer, for example. Alternatively, the gate line 6, gate electrode 6a, gate terminal connecting layer 6b and storage capacitor line 12 may each have a multilayer structure consisting of Mo (molybdenum), Al (aluminum) and Mo layers or may even have a single-layer structure, a double layer structure, or a multilayer structure consisting of four or more layers. Still alternatively, the gate line 6, gate electrode 6a, gate terminal connecting layer 6b and storage capacitor line 12 may be made of an element selected from the group consisting of Cu (copper), Al, Cr (chromium), Ta (tantalum), Ti (titanium), Mo and w or an alloy or metal nitride which is comprised mostly of any of these elements. The gate line 6, gate electrode 6a, gate terminal connecting layer 6b and storage capacitor line 12 may each have a thickness of approximately 420 nm. The thickness of the gate line 6, gate electrode 6a, gate terminal connecting layer 6b and storage capacitor line 12 suitably falls within the range of about 50 nm to about 600 nm, for example. The gate electrode 6a and gate terminal connecting layer 6b form integral parts of the same layer along with the gate line 6 and are electrically connected to the gate line 6. Meanwhile, the storage capacitor line 12 is not electrically connected to the gate line 6, gate electrode 6a and gate terminal connecting layer 6b.

In this embodiment, the gate insulating layer 7 has a single-layer structure. However, the gate insulating layer 7 may either consist of a single layer or have a multilayer structure consisting of two or more layers. The gate insulating layer 7 may be made of silicon nitride (SiNx) or silicon oxide (SiOx), for example. As the gate insulating layer 7, a silicon oxide (SiOx) layer, a silicon nitride (SiNx) layer, a silicon oxynitride (SiOxNy where x>y) layer or a silicon nitride oxide (SiNxOy where x>y) layer may be used appropriately. The gate insulating layer 7 may have a thickness of approximately 300 nm, for example.

The oxide semiconductor layer 9 may include an In—Ga—Zn—O based semiconductor (which will be referred to herein as an "In—Ga—Zn—O based semiconductor"), for example. In this case, the In—Ga—Zn—O based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The In—Ga—Zn—O based semiconductor may be either amorphous or crystalline. If the In—Ga—Zn—O based semiconductor is a crystalline one, a crystalline In—Ga—Zn—O based semiconductor of which the c axis is substantially perpendicular to the layer plane is suitably used. The crystal structure of such an In—Ga—Zn—O based semiconductor is disclosed, for example, in Japanese Laid-Open Patent Publication No. 2012-134475, the entire disclosure of which is hereby incorporated by reference.

A TFT including such an In—Ga—Zn—O based semiconductor has so high mobility (which is more than 20 times as high as that of an a-Si TFT) and so low leakage current (which is less than one hundredth of that of an a-Si TFT) as to be used effectively as a driver TFT and a pixel TFT.

The oxide semiconductor layer 9 does not have to be an In—Ga—Zn—O based semiconductor layer, but may also include a Zn—O based (ZnO) semiconductor, an In—Zn—O based (IZO™) semiconductor, a Zn—Ti—O based (ZTO) semiconductor, a Cd—Ge—O based semiconductor, a Cd—Pb—O based semiconductor, CdO (cadmium oxide), an Mg—Zn—O based semiconductor, an In—Sn—Zn—O based semiconductor (such as $In_2O_3$—$SnO_2$—ZnO) or an In—Ga—Sn—O based semiconductor, for example. Furthermore, the oxide semiconductor layer 9 may also be ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all.

An amorphous oxide semiconductor layer is suitably used as the oxide semiconductor layer 9, because the semiconductor layer can be formed at a low temperature and can achieve high mobility in that case. The oxide semiconductor layer 9 may have a thickness of approximately 50 nm, for example. The thickness of the oxide semiconductor layer 9 suitably falls within the range of about 30 nm to about 100 nm, for example.

The etch stop layer 11 has been formed to contact with the channel region of the oxide semiconductor layer 9. The etch stop layer 11 is suitably made of an insulating oxide (such as $SiO_2$). If the etch stop layer 11 is made of an insulating oxide, it is possible to prevent the oxygen deficiencies in the oxide semiconductor layer 9 from deteriorating the semiconductor properties. Alternatively, the etch stop layer 11 may also be made of SiON (which may be either silicon oxynitride or silicon nitride oxide), $Al_2O_2$ or $Ta_2O_5$, for example. The etch stop layer 11 may have a thickness of approximately 150 nm, for example. The thickness of the etch stop layer 11 suitably falls within the range of about 50 nm to about 300 nm, for example.

Each of the source electrode 8s, drain electrode 8d, first connecting layer 8x and third connecting layer 8y may have a multilayer structure comprised of Ti, Al and Ti layers, for example. Alternatively, the source electrode 8s, drain electrode 8d, first connecting layer 8x and third connecting layer 8y may each have a multilayer structure comprised of Mo, Al and Mo layers or may even have a single-layer structure, a double layer structure or a multilayer structure consisting of four or more layers. Furthermore, each of the source electrode 8s, drain electrode 8d, first connecting layer 8x and third connecting layer 8y may also be made of an element selected from the group consisting of Al, Cr, Ta, Ti, Mo and W, or an alloy or metal nitride comprised mostly of any of these elements. The source electrode 8s is electrically connected to the source line. The source electrode 8s, drain electrode 8d, first connecting layer 8x and third connecting layer 8y may each have a thickness of approximately 350 nm, for example. The thickness of each of the source electrode 8s, drain electrode 8d, first connecting layer 8x and third connecting layer 8y suitably falls within the range of about 50 nm to about 600 nm, for example.

The protective layer 13 may be made of SiNx, for example. The protective layer 13 may have a thickness of approximately 200 nm, for example. The thickness of the protective layer 13 suitably falls within the range of about 100 nm to about 500 nm, for example.

The organic insulating layer 14 may be made of a photosensitive resin, for example. The organic insulating layer 14 may have a thickness of approximately 2 µm, for example. The thickness of the interlayer insulating layer 14 suitably falls within the range of about 1 µm to about 3 µm, for example.

Each of the first and second transparent electrodes 15 and 19, second connecting layer 19a and transparent electrode 19b may be made of ITO (indium tin oxide), for example. The first and second transparent electrodes 15 and 19, second connecting layer 19a and transparent electrode 19b may each have a thickness of approximately 50 nm, for example. The thickness of each of the first and second transparent electrodes 15 and 19, second connecting layer 19a and transparent electrode 19b suitably falls within the range of about 20 nm to about 200 nm, for example.

The TFT substrate 1000A may be fabricated by the method to be described below.

A TFT substrate (1000A) fabricating method is a method for fabricating a semiconductor device including a TFT 100A, and includes the steps of: (A) forming a gate electrode 6a and a storage capacitor line 12 on a substrate 1; (B) forming a gate insulating layer 7 over the gate electrode 6a and the storage capacitor line 12; (C) forming an oxide semiconductor layer 9 on the gate insulating layer 7 so that the oxide semiconductor layer 9 overlaps with the gate electrode 6a when viewed along a normal to the substrate 1; (D) forming an insulating film over the oxide semiconductor layer 9 and the gate insulating layer 7 and etching a portion of the gate insulating layer 9 and the insulating film, thereby forming an etch stop layer 11 which has a hole 11u that overlaps with the storage capacitor line 12 when viewed along a normal to the substrate 1 and a hole 11v that exposes the oxide semiconductor layer 9 partially; and (E) forming a source electrode 8s, a drain electrode 8d and a first connecting layer 8x out of the same conductive film, in which the first connecting layer 8x is electrically connected to the storage capacitor line 12 and formed so as to cover the side surface of the hole 11u at least partially, and the source and drain electrodes 8s, 8d are electrically connected to the oxide semiconductor layer 9 inside the hole 11v.

As will be described in detail later, this is a simple method for fabricating a TFT substrate 1000A with a reduced number of manufacturing process steps, and therefore, the manufacturing cost can be cut down.

The TFT substrate (1000A) fabricating method preferably further includes the steps of: (F) forming a protective layer 13 over the etch stop layer 11; (G) forming an organic insulating layer 14 over the protective layer 13 so that the organic insulating layer 14 has a hole 14u which overlaps with the storage capacitor line 12 when viewed along a normal to the substrate 1; (H) forming a first transparent electrode 15 on the organic insulating layer 14 so that the first transparent electrode 15 covers the side surface of the hole 14u at least partially; and (I) forming a dielectric film over the first transparent electrode 15 and etching the dielectric film and the protective layer 13 simultaneously, thereby forming a dielectric layer 17 with a hole 17u which exposes the first connecting layer 8x partially.

The TFT substrate (1000A) fabricating method preferably further includes the step (J) of forming a second transparent electrode 219 and a second connecting layer 19a, which is not electrically connected to the second transparent electrode 19, on the dielectric layer 17, in which the second connecting layer 19a is electrically connected to the first transparent electrode 15 and the first connecting layer 19a inside the hole 17u and covers the side surface of the hole 17u at least partially.

Next, an exemplary method for fabricating the semiconductor device 1000A will be described specifically with reference to FIGS. 3 and 4. Portions (a1) through (e1) of FIG. 3 and portions (a1) to (c1) of FIG. 4 are cross-sectional views illustrating respective manufacturing process steps to make the TFT 100A shown in FIG. 2(a). Portions (a2) through (e2) of FIG. 3 and portions (a2) to (c2) of FIG. 4 are cross-sectional views illustrating respective process steps to form the storage capacitor connecting portion 200A shown in FIG. 2(b). Portions (a3) through (e3) of FIG. 3 and portions (a3) to (c3) of FIG. 4 are cross-sectional views illustrating respective process steps to form the storage capacitor connecting portion 200A shown in FIG. 2(c). And portions (a4) through (e4) of FIG. 3 and portions (a4) to (c4) of FIG. 4 are cross-sectional views illustrating respective process steps to form the gate terminal portion 300A shown in FIG. 2(d).

First of all, although not shown, a gate-line-to-be metal film is deposited to a thickness of about 50 nm to about 600 nm, for example, on the substrate 1. The gate-line-to-be metal film may be deposited on the substrate 1 by sputtering process, for example.

Figure 3:
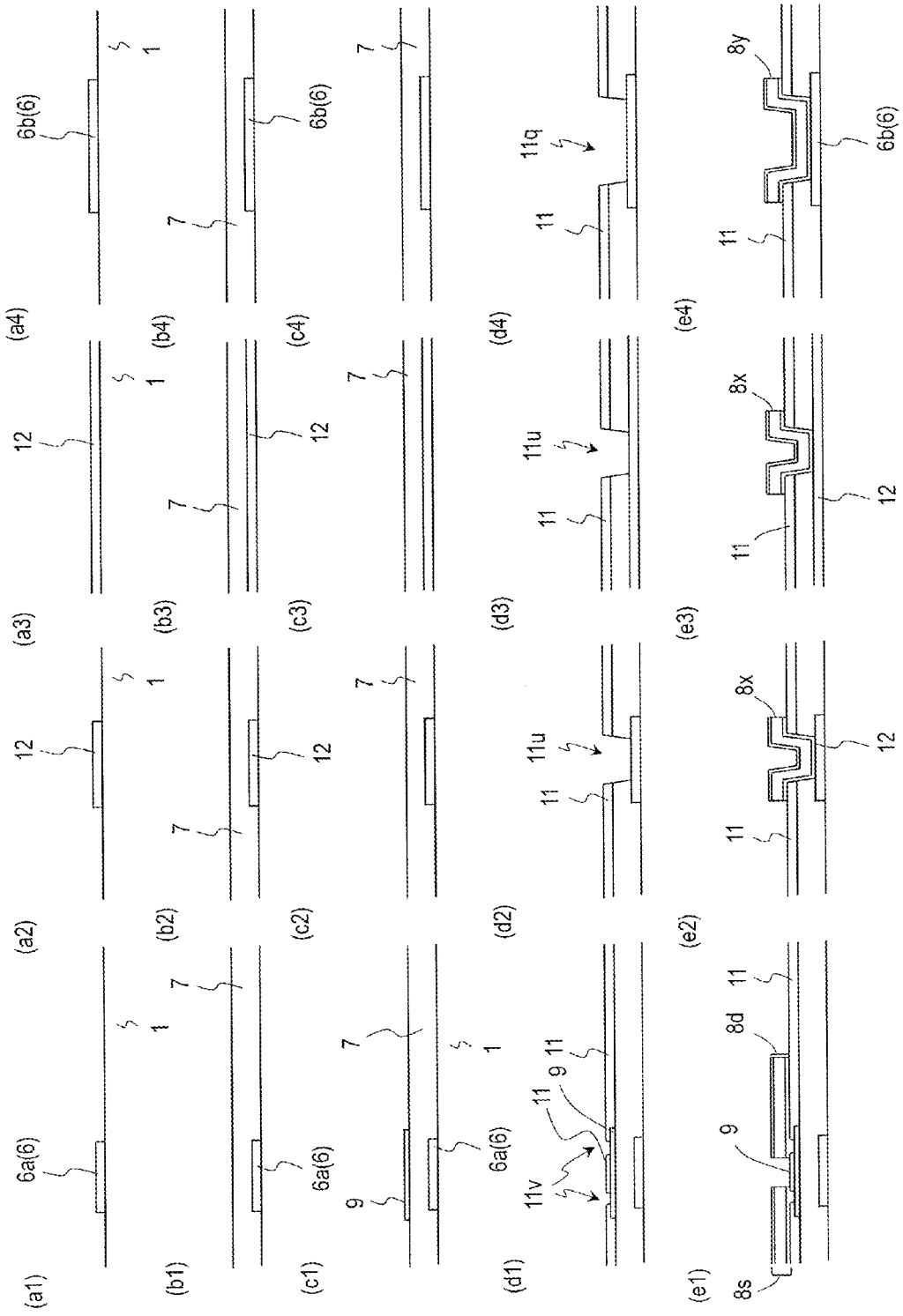
FIG. 3 (a1) through (e1) are schematic cross-sectional views illustrating respective manufacturing process steps to make the TFT 100A, (a2) through (e2) and (a3) through (e3) are schematic cross-sectional views illustrating respective process steps to form the storage capacitor connecting portion 200A. And (a4) through (e4) are schematic cross-sectional views illustrating respective process steps to form the gate terminal portion 300A.
Figure 4:
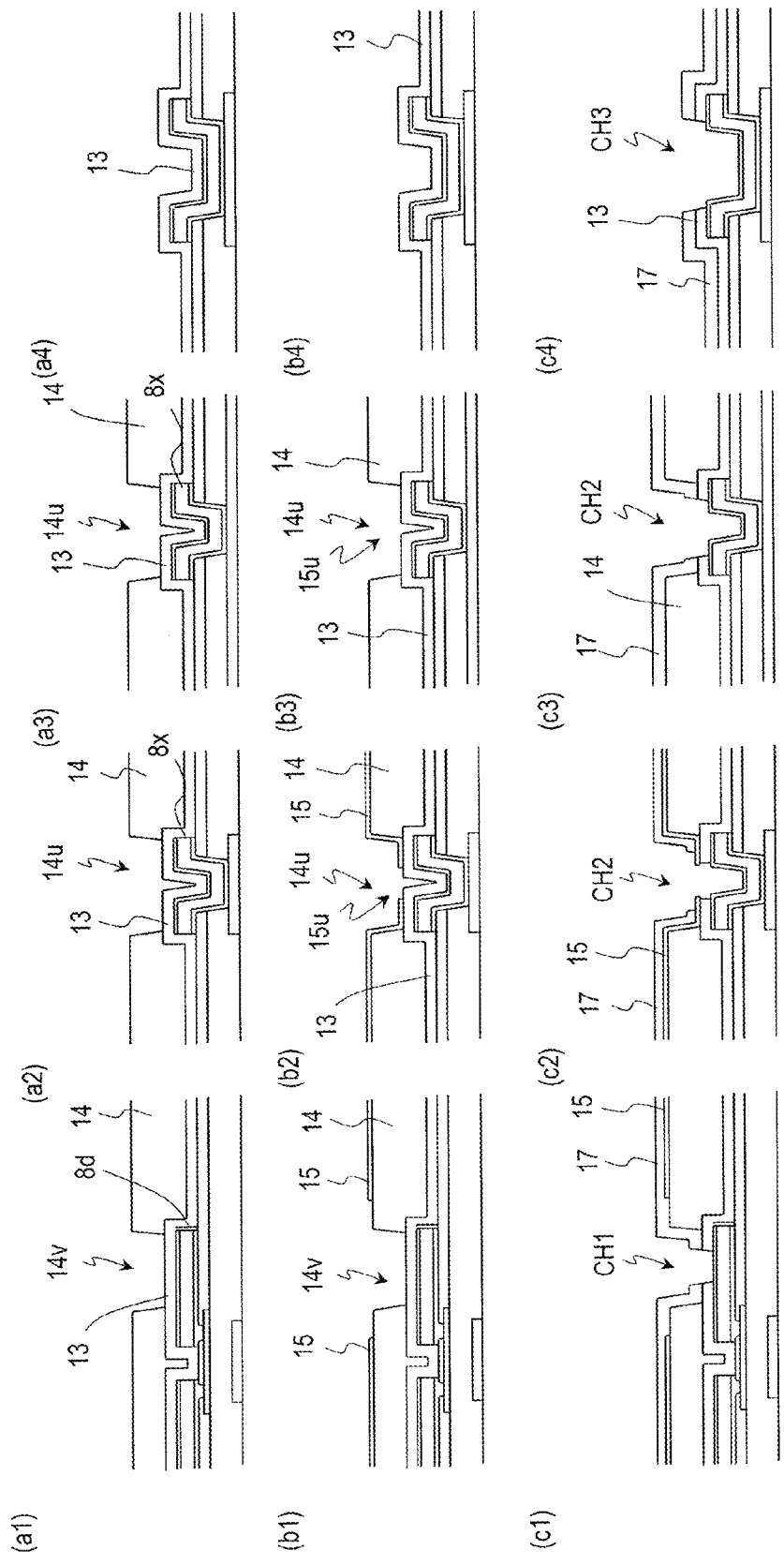
FIG. 4 (a1) through (c1) are schematic cross-sectional views illustrating respective manufacturing process steps to make the TFT 100A, (a2) through (c2) and (a3) through (c3) are schematic cross-sectional views illustrating respective process steps to form the storage capacitor connecting portion 200A. And (a4) through (c4) are schematic cross-sectional views illustrating respective process steps to form the gate terminal portion 300A.

Next, as shown in portions (a1) to (a4) of FIG. 3, a gate line 6 and storage capacitor line 12 are formed by patterning the gate-line-to-be metal film. In this process step, in the region where a TFT 100A is going to be formed, a gate electrode 6a to be electrically connected to the gate line 6 is formed as shown in portion (a1) of FIG. 3. Meanwhile, in the region where a gate terminal portion 300A is going to be formed, a gate terminal connecting layer 6b is formed as shown in portion (a4) of FIG. 3.

Subsequently, as shown in portions (b1) to (b4) of FIG. 3, a gate insulating layer 7 is formed by CVD process, for example, to have a thickness of approximately 300 nm, for example, over the gate line 6, the gate electrode 6a, the gate terminal connecting layer 6b and the storage capacitor line 12.

Thereafter, as shown in portions (c1) to (c4) of FIG. 3, an oxide semiconductor layer 9 is formed by sputtering process, for example, to have a thickness of approximately 50 nm, for example, and to overlap with the gate electrode 6a when viewed along a normal to the substrate 1.

Next, as shown in portions (d1) to (d4) of FIG. 3, an etch stop film (not shown) is deposited by CVD process, for example, to a thickness of approximately 150 nm over the gate insulating layer 7 and the oxide semiconductor layer 9 and then patterned by a known method. As a result, an etch stop layer 11 is formed so as to cover a portion of the oxide semiconductor layer 9 to be a channel region as shown in portion (d1) of FIG. 3. A hole 11v to electrically connect the source and drain electrodes 8s, 8d to be described later to the oxide semiconductor layer 9 is cut through the etch stop layer 11. Meanwhile, in the region where a storage capacitor connecting portion 200A is going to be formed as shown in portions (d2) and (d3) of FIG. 3, a hole 11u is created by selectively etching the etch stop film (not shown) and the gate insulating layer 7 simultaneously. And in the region where a gate terminal portion 300A is going to be formed as shown in portion (d4) of FIG. 3, a hole 11q is created. In the region shown in portion (d1) of FIG. 3, the oxide semiconductor layer 9 that has been formed under the etch stop film functions as an etch stop, and therefore, the gate insulating layer 7 under the oxide semiconductor layer 9 is not etched. These holes 11u and 11q are created so as to overlap with the storage capacitor line 12 and the gate terminal connecting layer 6b, respectively, when viewed along a normal to the substrate 1. These holes 11u and 11q can be created by using a single photomask. In addition, these holes 11u and 11q do not have to be created with an alignment margin and other parameters taken into account, and therefore, can have a smaller size.

Subsequently, as shown in portions (e1) to (e4) of FIG. 3, a source electrode 8s, a drain electrode 8d, a first connecting layer 8x and a third connecting layer 8y are formed by a known method to have a thickness of approximately 350 nm each. As shown in portion (e1) of FIG. 3, the source and drain electrodes 8s and 8d are formed on the etch stop layer 11 and electrically connected to the oxide semiconductor layer 9 inside the hole 11v of the etch stop layer 11. Meanwhile, in the region illustrated in portions (e2) and (e3) of FIG. 3, a first connecting layer 8x is formed so as to cover the side surface of the hole 11u at least partially. Also, the first connecting layer 8x is formed so as to cover the storage capacitor line 12 inside the hole 11u and is electrically connected to the storage capacitor line 12. In the same way, in the region illustrated in portion (e4) of FIG. 3, a third connecting layer 8y is formed so as to cover the side surface of the hole 11q at least partially. Also, the third connecting layer 8y is formed so as to cover the gate terminal connecting layer 6b inside the hole 11q and is electrically connected to the gate terminal connecting layer 6b. By providing the first and third connecting layers 8x and 8y, the storage capacitor line 12 and gate terminal connecting layer 6b which are exposed inside the holes 11u and 11q can be protected and can be prevented from being disconnected during an etching process.

Next, as shown in portions (a1) to (a4) of FIG. 4, a protective layer 13 is formed by CVD process, for example, over the source and drain electrodes 8s and 8d to have a thickness of approximately 150 nm, for example, and an organic insulating layer 14 with holes 14v and 14u is formed on the protective layer 13 by photolithographic process to have a thickness of approximately 1 µm, for example. The hole 14v is created to overlap with the drain electrode 8d when viewed along a normal to the substrate 1. On the other hand, the hole 14u is created to overlap with the first connecting layer 8x when viewed along a normal to the substrate 1. Meanwhile, in the region illustrated in portion (a4) of FIG. 4, the organic insulating layer 14 is not formed but the protective layer 13 is exposed.

Thereafter, as shown in portions (b1) to (b4) of FIG. 4, a first transparent electrode 15 is formed on the organic insulating layer 14 by sputtering process, for example. In the region shown in portion (b2) of FIG. 4 where the storage capacitor connecting portion 200A is going to be formed, the first transparent electrode 15 is formed so as to cover the side surface of the hole 14u at least partially. However, in the region shown in portion (b1) of FIG. 4, the first transparent electrode 15 is formed so as not to cover the side surface of the hole 14v. And in the region shown in portion (d4) of FIG. 4, the first transparent electrode 15 is not formed. A hole 15u is cut through the first transparent electrode 15 so as to overlap with the first connecting layer 8x when viewed along a normal to the substrate 1. Also, since a portion of the first transparent electrode 15 which overlaps with the first connecting layer 8x is formed to have a symmetric shape, the area of contact between the first and second transparent electrodes 15 and 19 does not change even if misalignment has occurred.

Next, although not shown, a dielectric film (insulating film) is formed over the first transparent electrode 15 and the protective layer 13 by CVD process, for example.

Thereafter, as shown in portion (c1) to (c4) of FIG. 4, a dielectric layer 17 with contact holes CH1 to CH3 is formed by selectively etching the dielectric film and the protective layer 13 simultaneously.

These contact holes CH1, CH2 and CH3 are created so as to partially expose the drain electrode 8d, the first connecting layer 8x and the third connecting layer 8y, respectively. Since the contact holes CH1 to CH3 can be created with a single photomask by etching the dielectric film and the protective layer 13 simultaneously in this manner, the manufacturing cost can be cut down.

The dielectric layer 17 is formed so as to cover the side surface of the holes 14v and 14u at least partially and to expose at least partially the first transparent electrode 15 inside the contact hole CH2.

Next, as shown in FIGS. 2(a) to 2(d), a second transparent electrode 19, a second connecting layer 19a and a transparent electrode 19b are formed out of the same transparent conductive film on the dielectric layer 17 by sputtering process, for example. The second transparent electrode 19, second connecting layer 19a and transparent electrode 19b are not electrically connected together.

The second transparent electrode 19 is electrically connected to the drain electrode 8d inside the contact hole CH1. The second connecting layer 19a is electrically connected to the first transparent electrode 15 and the first connecting layer 8x inside the contact hole CH2. As a result, the first transparent electrode 15 is electrically connected to the storage capacitor line 12 via the second connecting layer 19a. The transparent electrode 19b is electrically connected to the third connecting layer 8y inside the contact hole CH3.

Next, a TFT substrate 1000B as a modified example of the TFT substrate 1000A will be described with reference to FIG. 5. This TFT substrate 1000B will be described in comparison with the TFT substrates 1300a and 1300b of comparative examples shown in FIGS. 19 to 22. In the following description, any component having substantially the same function as its counterpart of the TFT substrate 1000A will be identified by the same reference numeral as its counterpart's, and its description will be omitted to avoid redundancies.

Figure 5:
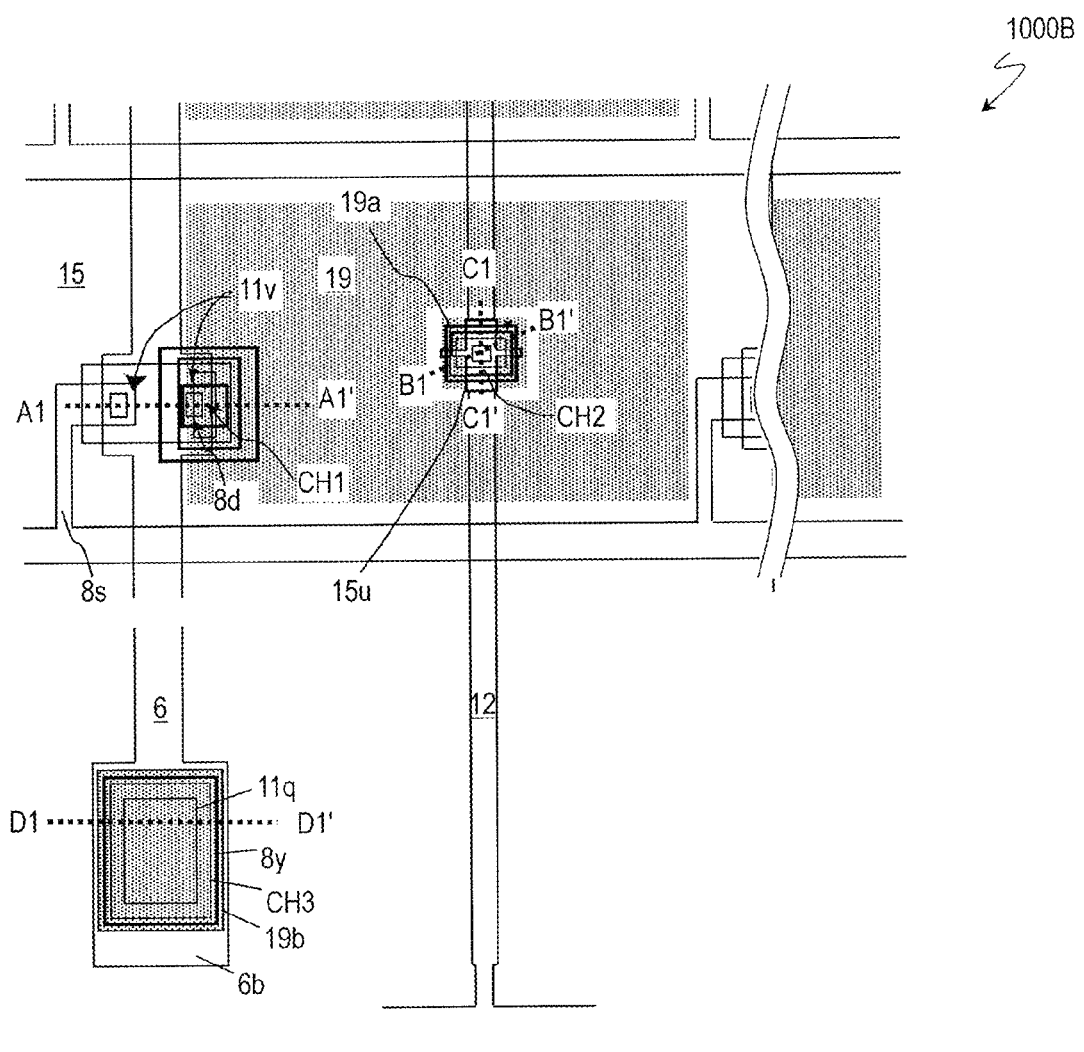
FIG. 5 A schematic plan view of a semiconductor device (TFT substrate) 1000B as another embodiment of the present invention.
Figure 19:
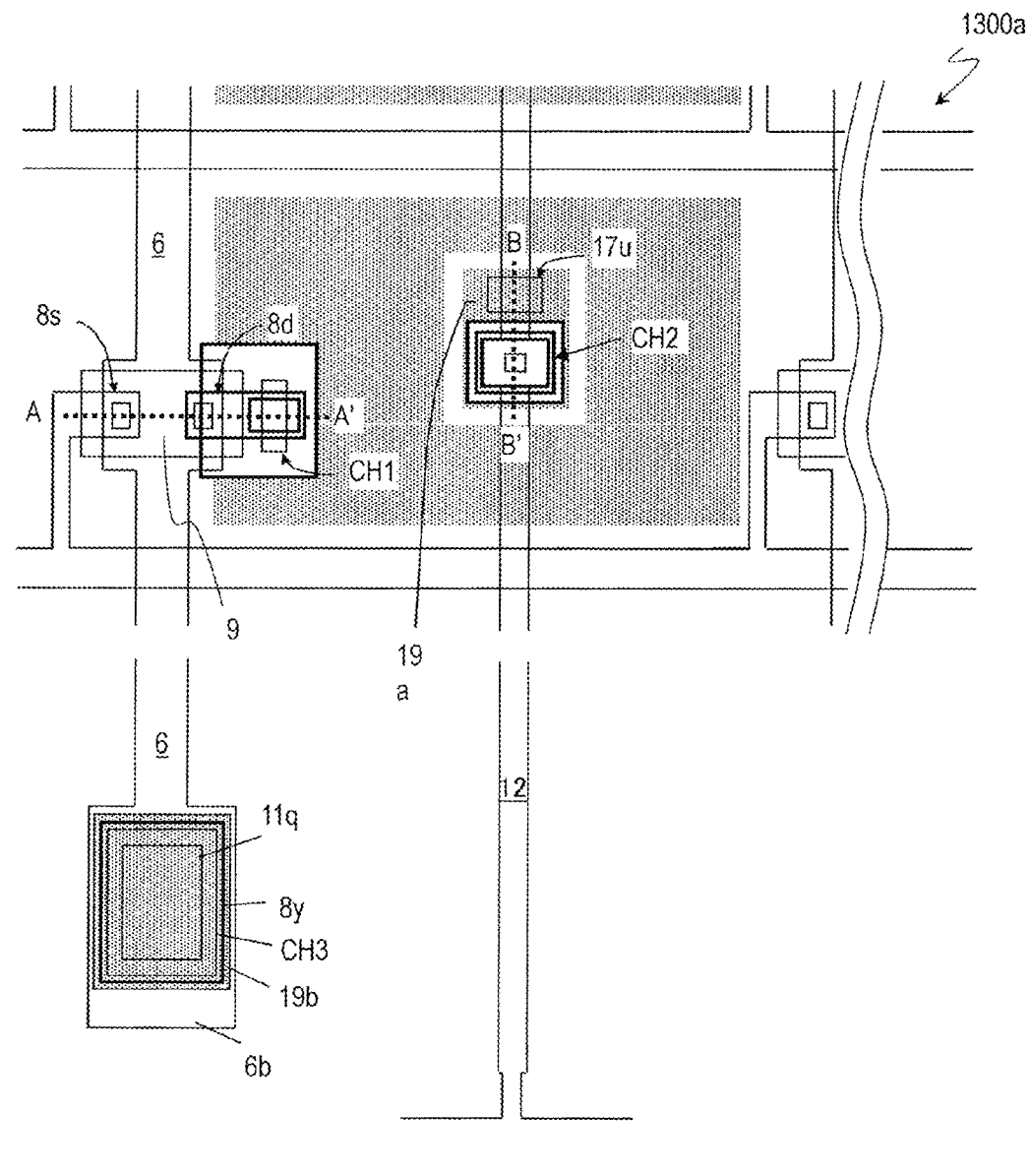
FIG. 19 A schematic plan view of a semiconductor device 1300a as a comparative example.
Figure 21:
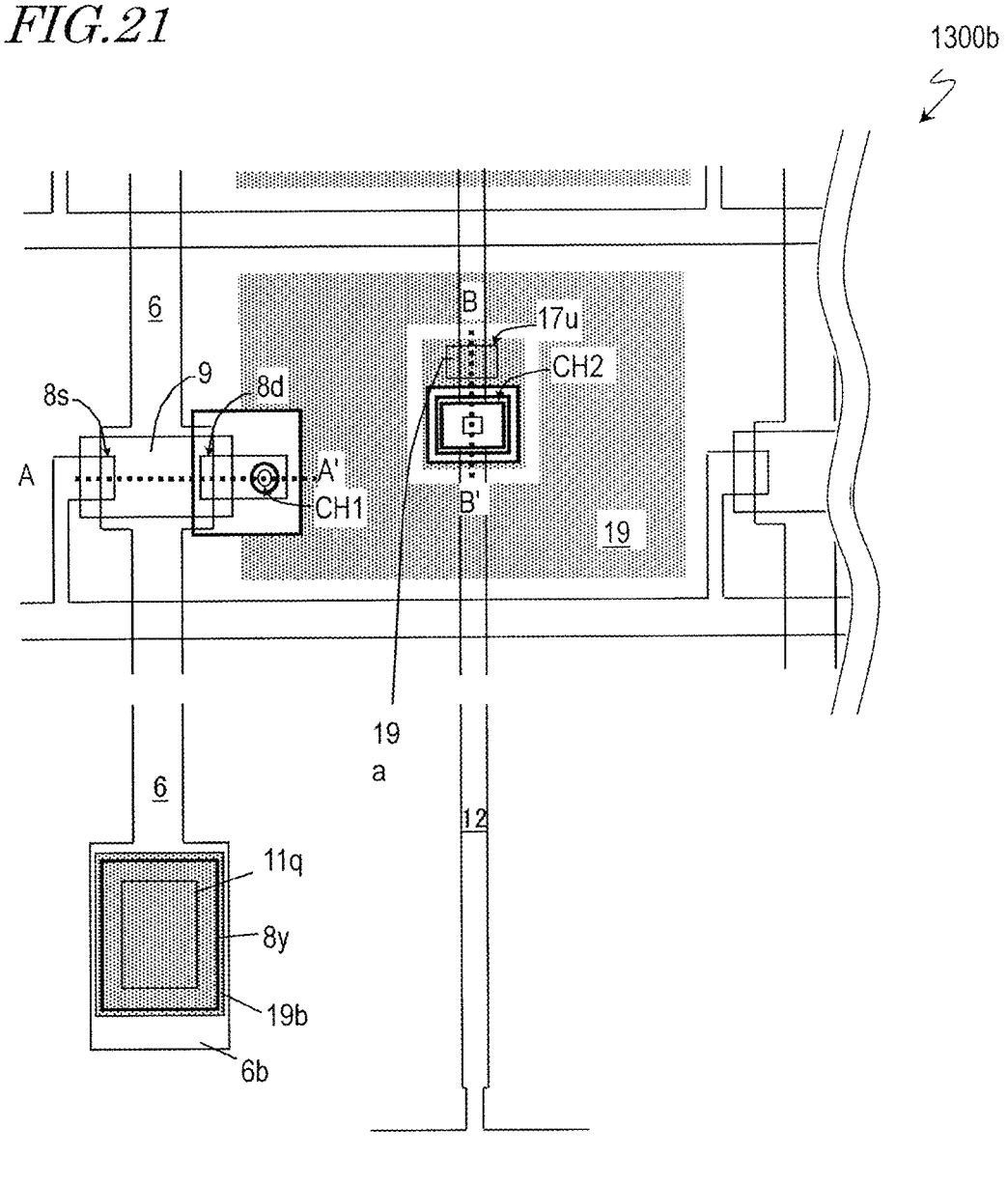
FIG. 21 A schematic plan view of a semiconductor device 1300b as another comparative example.

FIG. 5 is a schematic plan view illustrating the TFT substrate 1000B. Schematic cross-sectional views of the TFT substrate 1000B as respectively viewed on the planes A1-A1', B1-B1', C1-C1' and D1-D1' shown in FIG. 5 are supposed to be as shown in FIGS. 2(a) to 2(d), respectively. FIG. 19 is a schematic plan view of a TFT substrate 1300a as a comparative example. FIG. 20(a) is a schematic cross-sectional view of a TFT 130a as viewed on the plane A-A' shown in FIG. 19. FIG. 20(b) is a schematic cross-sectional view of a storage capacitor connecting portion 230a as viewed on the plane B-B' shown in FIG. 19. FIG. 21 is a schematic plan view of a TFT substrate 1300b as another comparative example. FIG. 22(a) is a schematic cross-sectional view of a TFT 130b as viewed on the plane A-A' shown in FIG. 21. FIG. 22(b) is a schematic cross-sectional view of the TFT 130b as viewed on the plane B-B' shown in FIG. 21.

First of all, the TFT substrates 1300a and 1300b of the comparative examples each include a TFT 130a, 130b. The TFT substrates 1300a and 1300b of the comparative examples each include a storage capacitor connecting portion 230a, 230b. Each of the TFT substrates 1300a and 1300b of the comparative examples includes: a protective layer 13 formed over the TFT 130a, 130b; an organic insulating layer 14 formed over the protective layer 13; a first transparent electrode 15 formed on the organic insulating layer 14; a dielectric layer formed over the first transparent electrode 15; and a second transparent electrode 19 formed on the dielectric layer 17. The dielectric layer 17 has a hole 17u which is located over the first transparent electrode 15. A region around the hole 17u does not contribute to a display operation. The second transparent electrode 19 is electrically connected to the drain electrode 8d inside the contact hole CH1. The storage capacitor connecting portions 230a and 230b each include a storage capacitor line 12, a first connecting layer 8x which is electrically connected to the storage capacitor line 12, and a second connecting layer 19a which is electrically connected to the first connecting layer 8x inside the contact hole CH2.

The first transparent electrode 15 is electrically connected to the second connecting layer 19a inside the hole 17u. Thus, the first transparent electrode 15 is electrically connected to the storage capacitor line 12 via the first and second connecting layers 8x and 19a.

As shown in FIG. 5, in the TFT substrate 1000B, the first transparent electrode 15 and the second connecting layer 19a are electrically connected together inside the contact hole CH2. That is why in the TFT substrate 1000B, there is no need to create the hole 17u as shown in FIGS. 19 to 22 and the area of the second transparent electrode (pixel electrode) 19 can be increased as much as possible.

The TFT substrate 1000B can be fabricated by the same method as the TFT substrate 1000A, and description thereof will be omitted herein.

Hereinafter, a TFT substrate 1000C as another embodiment of the present invention will be described with reference to FIGS. 6 and 7. In the following description, any component having substantially the same function as its counterpart of the TFT substrate 1000A will be identified by the same reference numeral as its counterpart's, and its description will be omitted to avoid redundancies.

Figure 6:
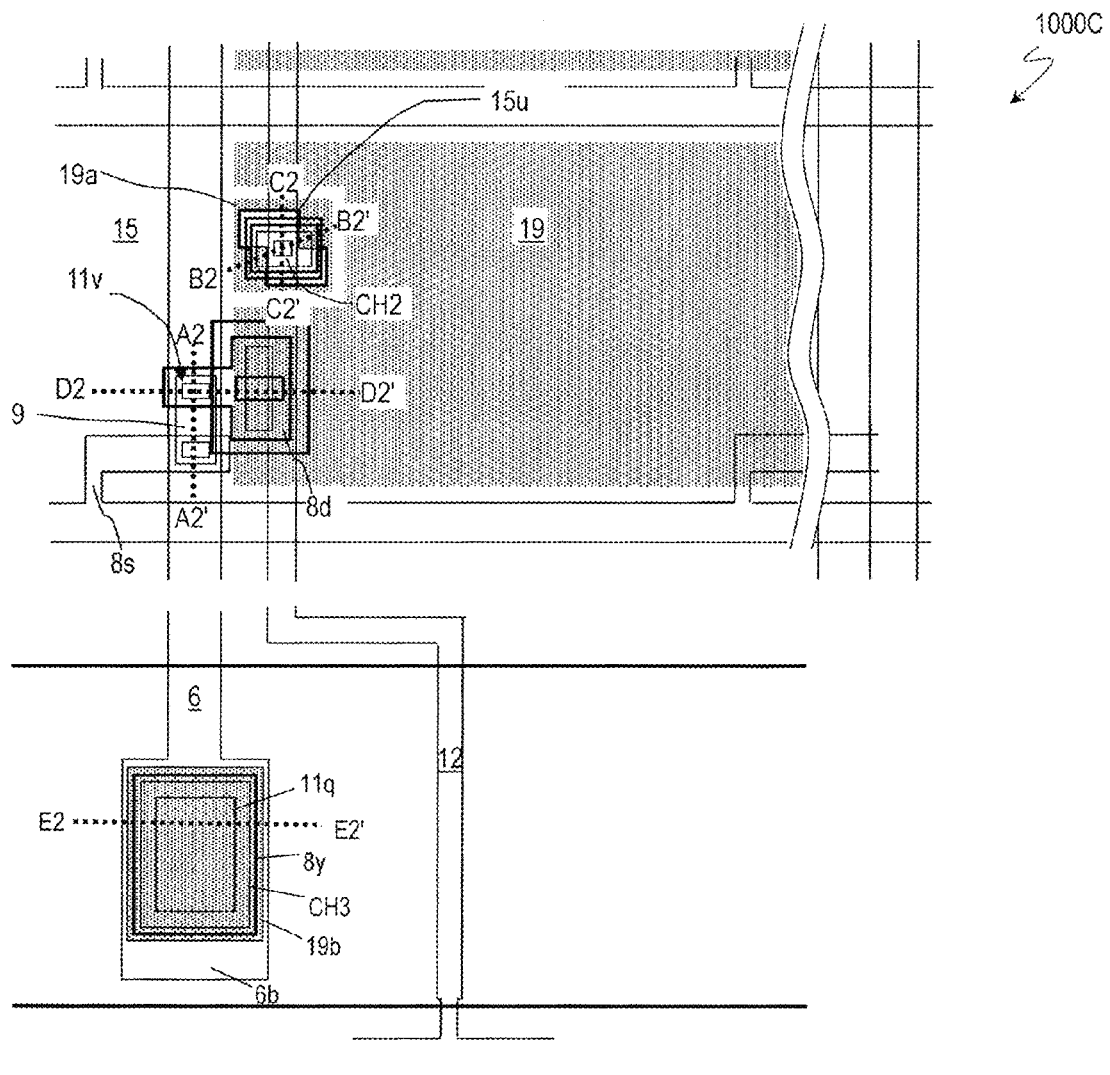
FIG. 6 A schematic plan view of a semiconductor device (TFT substrate) 1000C as still another embodiment of the present invention.

FIG. 6 schematically illustrates an exemplary planar structure of a semiconductor device (TFT substrate) 1000C as still another embodiment of the present invention. FIGS. 7(a) and 7(b) are schematic cross-sectional views of a TFT 100C as respectively viewed on the planes A2-A2' and D2-D2' shown in FIG. 6. FIGS. 7(c) and 7(d) are schematic cross-sectional views of a storage capacitor connecting portion 200C as respectively viewed on the planes B2-B2' and C2-C2' shown in FIG. 6. And FIG. 7(e) is a schematic cross-sectional view of a gate terminal portion 300C as viewed on the plane E2-E2' shown in FIG. 6.

In this TFT substrate 1000C, the entire oxide semiconductor layer 9 is located over the gate line 6, and the storage capacitor line 12 is arranged near the gate line 6, which are major differences from the TFT substrate 1000A. Also, in this TFT substrate 1000C, when viewed along a normal to the substrate 1, at least a part of the drain electrode 8d overlaps with the storage capacitor line 12 via the gate insulating layer 7 and the etch stop layer 11. The TFT substrate 1000C with such a configuration has no oxide semiconductor layer 9 inside the pixel, and therefore, can have an increased pixel aperture ratio.

Figure 7:
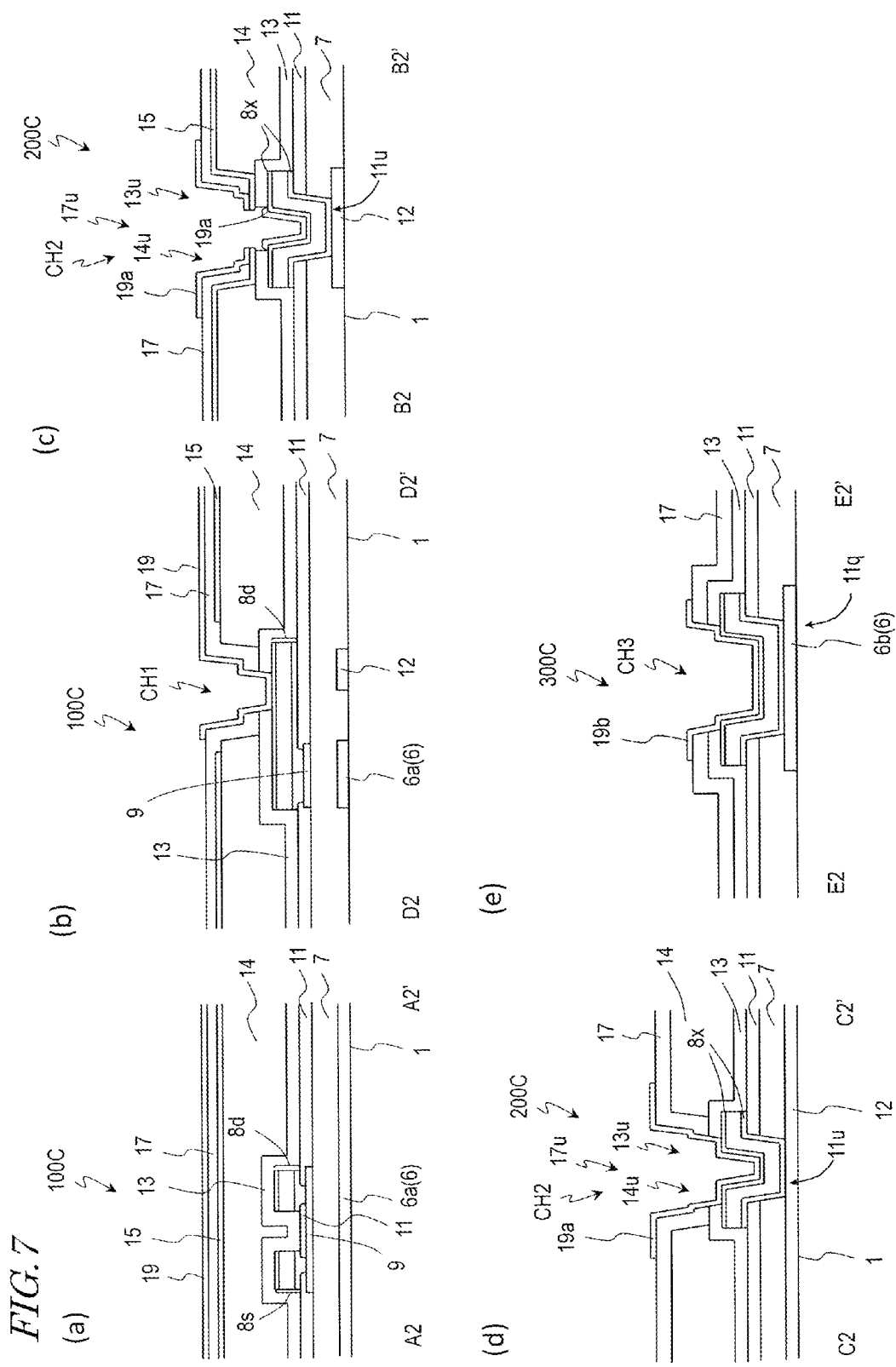
FIG. 7 (a) is a schematic cross-sectional view of a TFT 100C as viewed on the plane A2-A2' shown in FIG. 6, (b) is a schematic cross-sectional view of the TFT 100C as viewed on the plane D2-D2' shown in FIG. 6, (c) is a schematic cross-sectional view of a storage capacitor connecting portion 200C as viewed on the plane B2-B2' shown in FIG. 6, (d) is a schematic cross-sectional view of the storage capacitor connecting portion 200C as viewed on the plane C2-C2' shown in FIG. 6, and (e) is a schematic cross-sectional view of a gate terminal portion 300C as viewed on the plane E2-E2' shown in FIG. 6.
Figure 8:
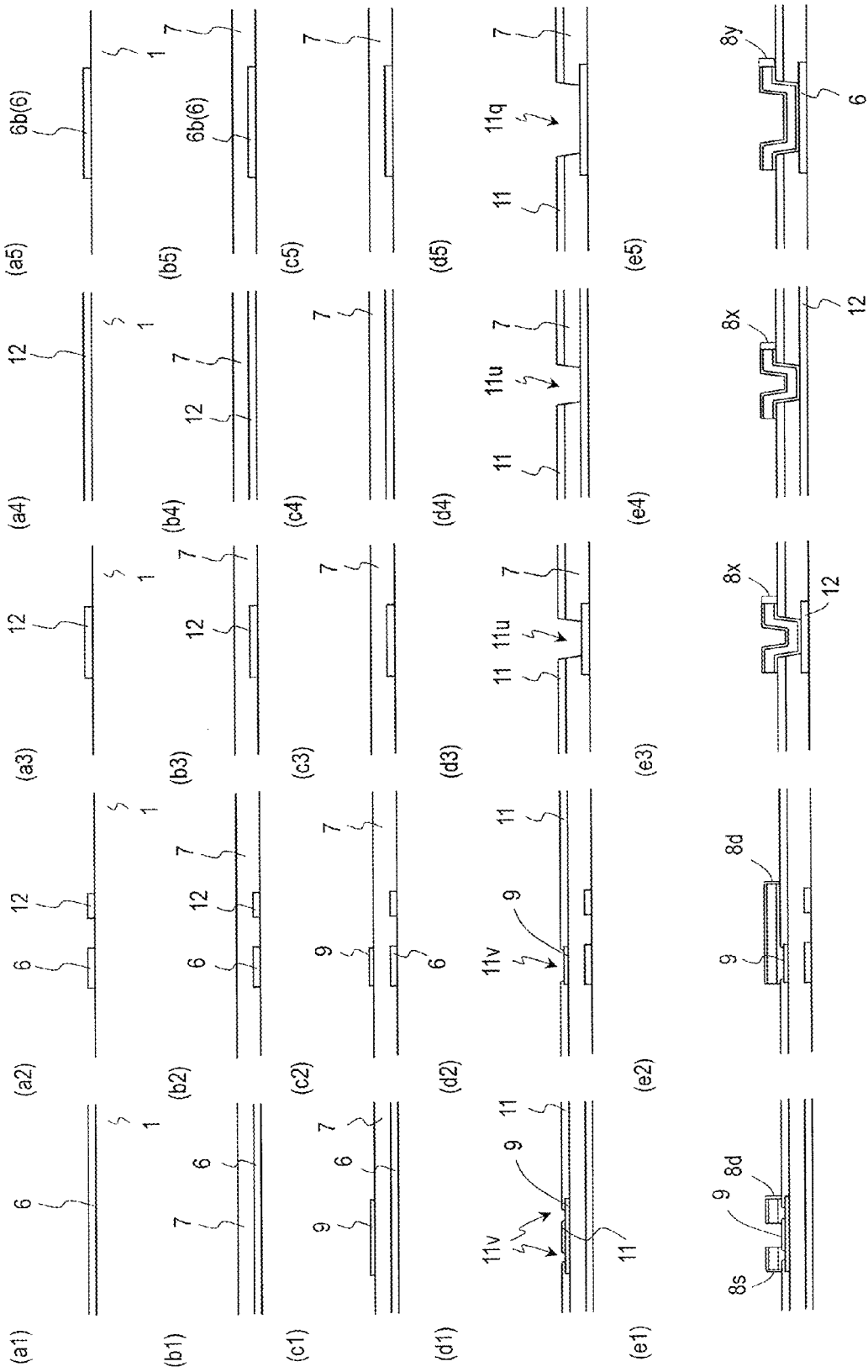
FIG. 8 (a1) through (e1) and (a2) through (e2) are schematic cross-sectional views illustrating respective manufacturing process steps to make the TFT 100C, (a3) through (e3) and (a4) through (e4) are schematic cross-sectional views illustrating respective process steps to form the storage capacitor connecting portion 200C. And (a5) through (e5) are schematic cross-sectional views illustrating respective process steps to form the gate terminal portion 300C.
Figure 9:
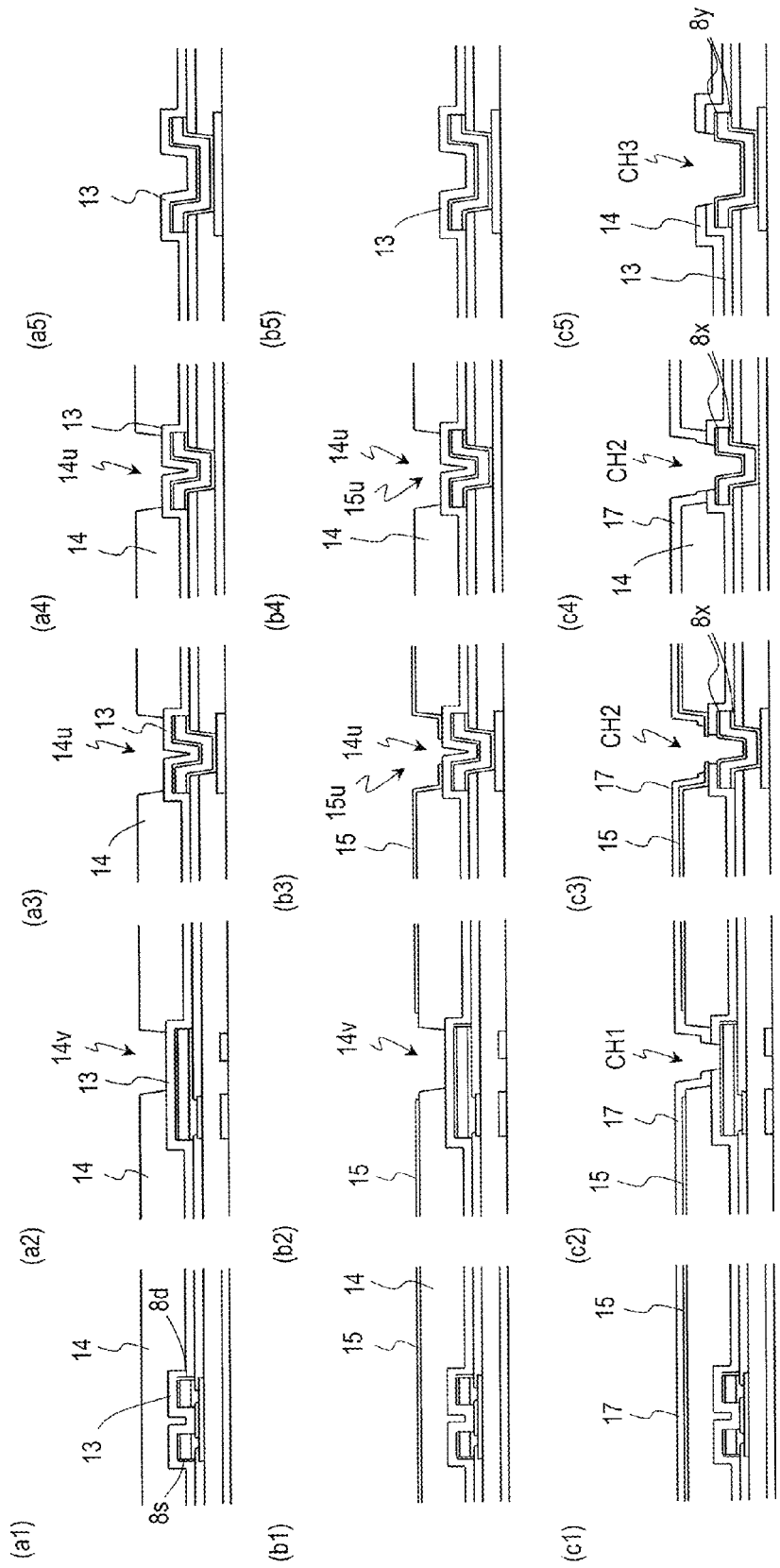
FIG. 9 (a1) through (c1) and (a2) through (c2) are schematic cross-sectional views illustrating respective manufacturing process steps to make the TFT 100C, (a3) through (c3) and (a4) through (c4) are schematic cross-sectional views illustrating respective process steps to form the storage capacitor connecting portion 200C. And (a5) through (c5) are schematic cross-sectional views illustrating respective process steps to form the gate terminal portion 300C.

Next, an exemplary method for fabricating the semiconductor device 1000C will be described specifically with reference to FIGS. 8 and 9. Portions (a1) through (e1) of FIG. 8 and portions (a1) to (c1) of FIG. 9 are cross-sectional views illustrating respective manufacturing process steps to make the TFT 100C shown in FIG. 7(a). Portions (a2) through (e2)

of FIG. 8 and portions (a2) to (c2) of FIG. 9 are cross-sectional views illustrating respective manufacturing process steps to make the TFT 100C shown in FIG. 7(*b*). Portions (a3) through (e3) of FIG. 8 and portions (a3) to (c3) of FIG. 9 are cross-sectional views illustrating respective process steps to form the storage capacitor connecting portion 200C shown in FIG. 7(*c*). Portions (a4) through (e4) of FIG. 8 and portions (a4) to (c4) of FIG. 9 are cross-sectional views illustrating respective process steps to form the storage capacitor connecting portion 200C shown in FIG. 7(*d*). And portions (a5) through (e5) of FIG. 8 and portions (a5) to (c5) of FIG. 9 are cross-sectional views illustrating respective process steps to form the gate terminal portion 300C shown in FIG. 7(*e*).

First of all, although not shown, a gate-line-to-be metal film is deposited by the method described above on the substrate 1. The gate-line-to-be metal film may be deposited on the substrate 1 by sputtering process, for example.

Next, as shown in portions (a1) to (a5) of FIG. 8, a gate line 6 (including a gate terminal connecting layer 6*b*) and storage capacitor line 12 are formed by patterning the gate-line-to-be metal film. The storage capacitor line 12 is formed near the gate line 6.

Subsequently, as shown in portions (b1) to (b5) of FIG. 8, a gate insulating layer 7 is formed by CVD process, for example, over the gate line 6 and the storage capacitor line 12.

Thereafter, as shown in portions (c1) to (c5) of FIG. 8, an oxide semiconductor layer 9 is formed by sputtering process, for example, to overlap with the gate line 6 when viewed along a normal to the substrate 1.

Next, as shown in portions (d1) to (d5) of FIG. 8, an etch stop film (not shown) is deposited by CVD process, for example, over the gate insulating layer 7 and the oxide semiconductor layer 9 and then patterned by a known method. As a result, an etch stop layer 11 is formed so as to cover a portion of the oxide semiconductor layer 9 to be a channel region as shown in portion (d1) of FIG. 8. A hole 11*v* to electrically connect the source and drain electrodes 8*s*, 8*d* to be described later to the oxide semiconductor layer 9 is cut through the etch stop layer 11 as shown in portions (d1) and (d2) of FIG. 8. Meanwhile, in the region where a storage capacitor connecting portion 200C is going to be formed as shown in portions (d3) and (d4) of FIG. 8, a hole 11*u* is created by selectively etching the etch stop film (not shown) and the gate insulating layer 7 simultaneously. And in the region where a gate terminal portion 300C is going to be formed as shown in portion (d5) of FIG. 8, a hole 11*q* is created. In the region shown in portions (d1) and (d2) of FIG. 8, the oxide semiconductor layer 9 that has been formed under the etch stop film functions as an etch stop, and therefore, the gate insulating layer 7 under the oxide semiconductor layer 9 is not etched. These holes 11*u* and 11*q* are created so as to overlap with the storage capacitor line 12 and the gate terminal connecting layer 6*b*, respectively, when viewed along a normal to the substrate 1.

Subsequently, as shown in portions (e1) to (e5) of FIG. 8, a source electrode 8*s*, a drain electrode 8*d*, a first connecting layer 8*x* and a third connecting layer 8*y* are formed by a known method. As shown in portions (e1) and (e2) of FIG. 8, the source and drain electrodes 8*s* and 8*d* are formed on the etch stop layer 11 and electrically connected to the oxide semiconductor layer 9 inside the hole 11*v* of the etch stop layer 11. Meanwhile, in the region illustrated in portions (e3) and (e4) of FIG. 8, a first connecting layer 8*x* is formed so as to cover the side surface of the hole 11*u* at least partially. Also, the first connecting layer 8*x* is formed so as to cover the storage capacitor line 12 inside the hole 11*u* and is electrically connected to the storage capacitor line 12. In the same way, in the region illustrated in portion (e5) of FIG. 8, a third connecting layer 8*y* is formed so as to cover the side surface of the hole 11*q* at least partially. Also, the third connecting layer 8*y* is formed so as to cover the gate terminal connecting layer 6*b* inside the hole 11*q* and is electrically connected to the gate line 6. By providing the first and third connecting layers 8*x* and 8*y*, the storage capacitor line 12 and gate terminal connecting layer 6*b* which are exposed inside the holes 11*u* and 11*q* can be protected and can be prevented from being disconnected during an etching process.

Next, as shown in portions (a1) to (a5) of FIG. 9, a protective layer 13 is formed by CVD process, for example, over the source and drain electrodes 8*s* and 8*d*, and an organic insulating layer 14 with holes 14*v* and 14*u* is formed on the protective layer 13 by photolithographic process. The hole 14*v* is created to overlap with the drain electrode 8*d* when viewed along a normal to the substrate 1. On the other hand, the hole 14*u* is created to overlap with the first connecting layer 8*x* when viewed along a normal to the substrate 1. Meanwhile, in the region illustrated in portion (a5) of FIG. 9, the organic insulating layer 14 is not formed but the protective layer 13 is exposed.

Thereafter, as shown in portions (b1) to (b5) of FIG. 9, a first transparent electrode 15 is formed on the organic insulating layer 14 by sputtering process, for example. In the region shown in portion (b3) of FIG. 9 where the storage capacitor connecting portion 200C is going to be formed, the first transparent electrode 15 is formed so as to cover the side surface of the hole 14*u* at least partially. However, in the region shown in portion (b2) of FIG. 9, the first transparent electrode 15 is formed so as not to cover the side surface of the hole 14*v*. And in the region shown in portion (b5) of FIG. 9, the first transparent electrode 15 is not formed. A hole 15*u* is cut through the first transparent electrode 15 so as to overlap with the first connecting layer 8*x* when viewed along a normal to the substrate 1. Also, since a portion of the first transparent electrode 15 which overlaps with the first connecting layer 8*x* is formed to have a symmetric shape, the area of contact between the first and second transparent electrodes 15 and 19 does not change even if misalignment has occurred.

Next, although not shown, a dielectric film (insulating film) is formed over the first transparent electrode 15 and the protective layer 13 by CVD process, for example.

Thereafter, as shown in portion (c1) to (c5) of FIG. 9, a dielectric layer 17 with contact holes (holes) CH1 to CH3 is formed by selectively etching the dielectric film and the protective layer 13 simultaneously.

These contact holes CH1, CH2 and CH3 are created so as to partially expose the drain electrode 8*d*, the first connecting layer 8*x* and the third connecting layer 8*y*, respectively. Since the contact holes CH1 to CH3 can be created with a single photomask by etching the dielectric film and the protective layer 13 simultaneously in this manner, the manufacturing cost can be cut down. In addition, these contact holes CH1 to CH3 can be created without using multiple photomasks.

The dielectric layer 17 is formed so as to cover the side surface of the holes 14*v* and 14*u* at least partially and to expose at least partially the first transparent electrode 15 inside the contact hole CH2.

Next, as shown in FIGS. 7(*a*) to 7(*e*), a second transparent electrode 19, a second connecting layer 19*a* and a transparent electrode 19*b* are formed out of the same transparent conductive film on the dielectric layer 17 by sputtering process, for example. The second transparent electrode 19, second connecting layer 19*a* and transparent electrode 19*b* are not electrically connected together.

The second transparent electrode 19 is electrically connected to the drain electrode 8*d* inside the contact hole CH1.

The second connecting layer 19a is electrically connected to the first transparent electrode 15 and the first connecting layer 8x inside the contact hole CH2. As a result, the first transparent electrode 15 is electrically connected to the storage capacitor line 12 via the second connecting layer 19a. The transparent electrode 19b is electrically connected to the third connecting layer By inside the contact hole CH3.

Hereinafter, a TFT substrate 1000D as yet another embodiment of the present invention will be described with reference to FIGS. 10 and 11. In the following description, any component having substantially the same function as its counterpart of the TFT substrate 1000A will be identified by the same reference numeral as its counterpart's, and its description will be omitted to avoid redundancies.

Figure 10:
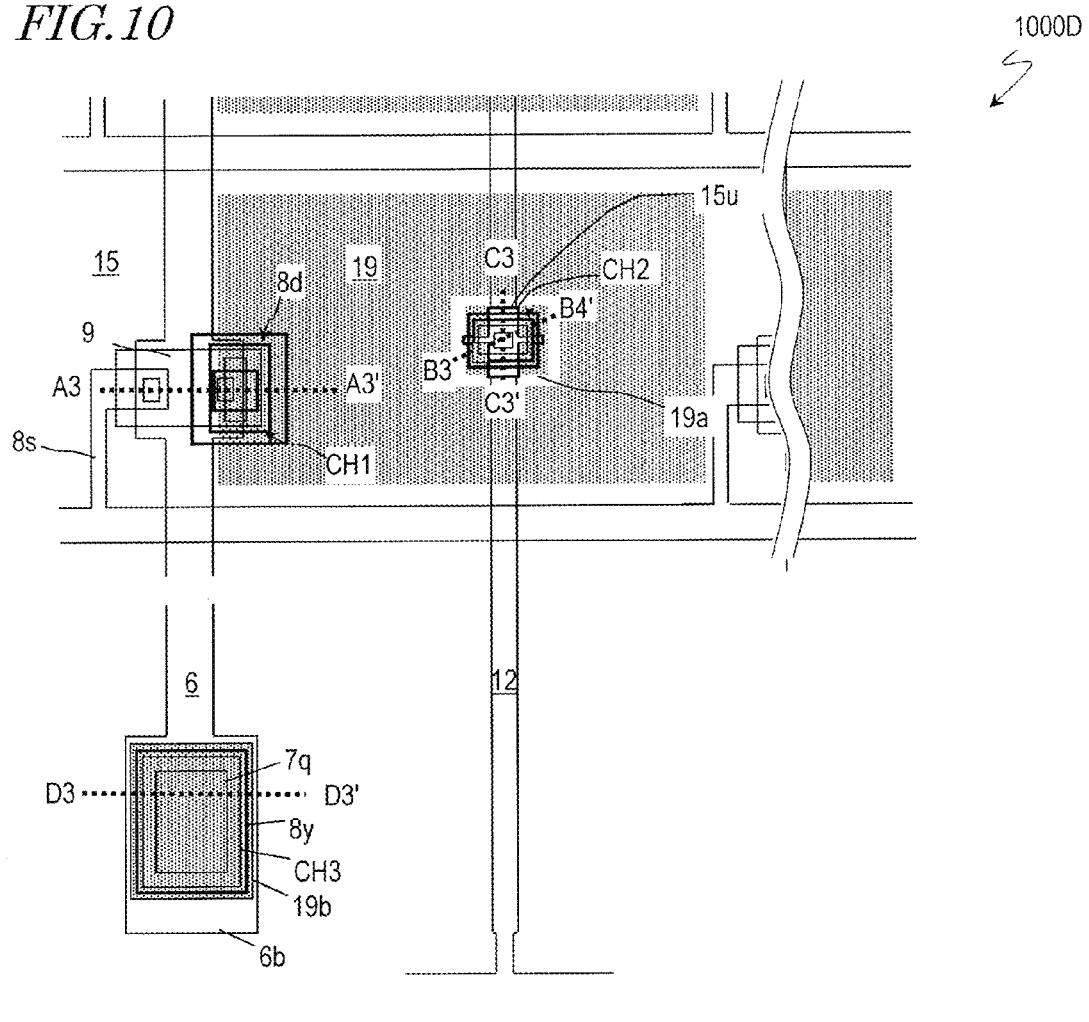
FIG. 10 A schematic plan view of a semiconductor device (TFT substrate) 1000D as yet another embodiment of the present invention.
Figure 11:
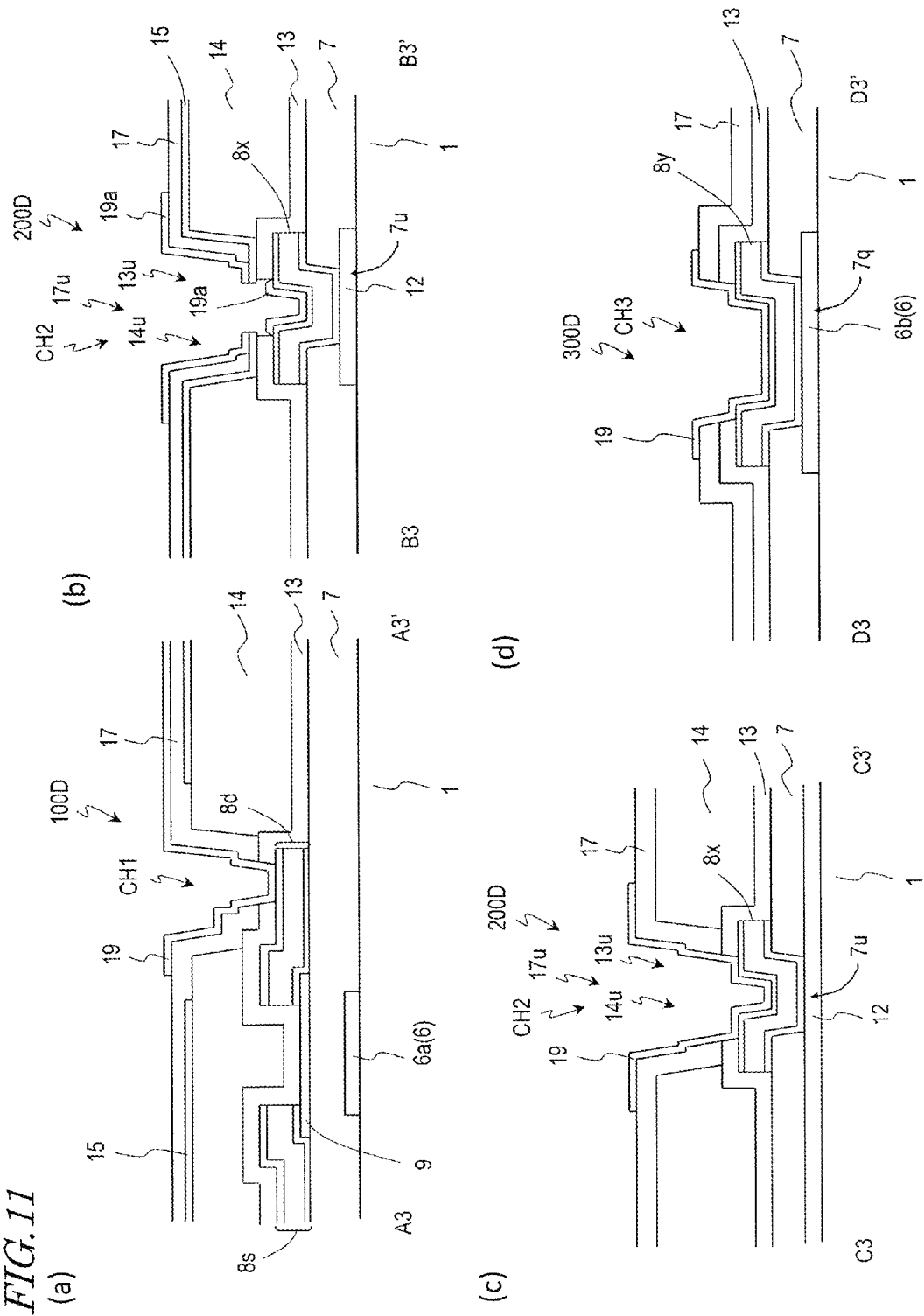
FIG. 11 (a) is a schematic cross-sectional view of a TFT 100D as viewed on the plane A3-A3' shown in FIG. 10, (b) is a schematic cross-sectional view of a storage capacitor connecting portion 200D as viewed on the plane B3-B3' shown in FIG. 10, (c) is a schematic cross-sectional view of the storage capacitor connecting portion 200D as viewed on the plane C3-C3' shown in FIG. 10, and (d) is a schematic cross-sectional view of a gate terminal portion 300D as viewed on the plane D3-D3' shown in FIG. 10.

FIG. 10 schematically illustrates an exemplary planar structure of a semiconductor device (TFT substrate) 1000D as yet another embodiment of the present invention. FIG. 11(a) is a schematic cross-sectional view of a TFT 100D as viewed on the plane A3-A3' shown in FIG. 10. FIGS. 11(b) and 11(c) are schematic cross-sectional views of a storage capacitor connecting portion 200D as respectively viewed on the planes B3-B3' and C3-C3' shown in FIG. 10. And FIG. 11(d) as a schematic cross-sectional view of a gate terminal portion 300D as viewed on the plane D3-D3' shown in FIG. 10.

This TFT substrate 1000D has no etch stop layer 11, which is a difference from the TFT substrate 1000A. And this TFT substrate 1000D includes a channel-etch-type TFT 100D. The TFT substrate 1000D with such a configuration does not need the etch stop layer 11, and therefore, can be fabricated by a simpler method at a reduced manufacturing cost.

This TFT substrate 1000D may be fabricated by the following method, for example.

A TFT substrate (1000D) fabricating method is a method for fabricating a semiconductor device including a TFT 100D, and includes the steps of: (A) forming a gate electrode 6a and a storage capacitor line 12 on a substrate; (B) forming a gate insulating layer 7 over the gate electrode 6a and the storage capacitor line 12 so that the gate insulating layer 7 has a hole 7u which overlaps with the storage capacitor line 12 when viewed along a normal to the substrate 1; (C) forming an oxide semiconductor layer 9 on the gate insulating layer 7 so that the oxide semiconductor layer 9 overlaps with the gate electrode 6a when viewed along a normal to the substrate 1; and (D) forming a source electrode 8s, a drain electrode 8d and a first connecting layer 8x out of the same conductive film, in which the first connecting layer 8x is electrically connected to the storage capacitor line 12 and formed so as to cover the side surface of the hole 7u at least partially, and the source and drain electrodes 8s, 8d are electrically connected to the oxide semiconductor layer 9.

Next, an exemplary method for fabricating the semiconductor device 1000D will be described specifically with reference to FIGS. 12 and 13. Portions (a1) through (c1) of FIG. 12 and portions (a1) and (b1) of FIG. 13 are cross-sectional views illustrating respective manufacturing process steps to make the TFT 100D shown in FIG. 11(a). Portions (a2) through (c2) of FIG. 12 and portions (a2) and (b2) of FIG. 13 are cross-sectional views illustrating respective process steps to form the storage capacitor connecting portion 200C shown in FIG. 11(b). Portions (a3) through (c3) of FIG. 12 and portions (a3) and (b3) of FIG. 13 are cross-sectional views illustrating respective process steps to form the storage capacitor connecting portion 200C shown in FIG. 11(c). And portions (a4) through (c4) of FIG. 12 and portions (a4) and (b4) of FIG. 13 are cross-sectional views illustrating respective process steps to form the gate terminal portion 300D shown in FIG. 11(d).

A gate line 6, a gate electrode 6a and a storage capacitor line 12 (including a gate terminal connecting layer 6b) are formed as described above on the substrate 1.

Next, a gate insulating layer 7 is formed as described above over the gate line 6, the gate electrode 6a and the storage capacitor line 12. In this process step, holes 7u and 7q are cut through the gate insulating layer 7 as shown in portions (a1) through (a4) of FIG. 12. The hole 7u is created so as to overlap with the storage capacitor line 12 when viewed along a normal to the substrate 1. And the hole 7q is created so as to overlap with the gate terminal connecting layer 6b when viewed along a normal to the substrate 1.

Figure 12:
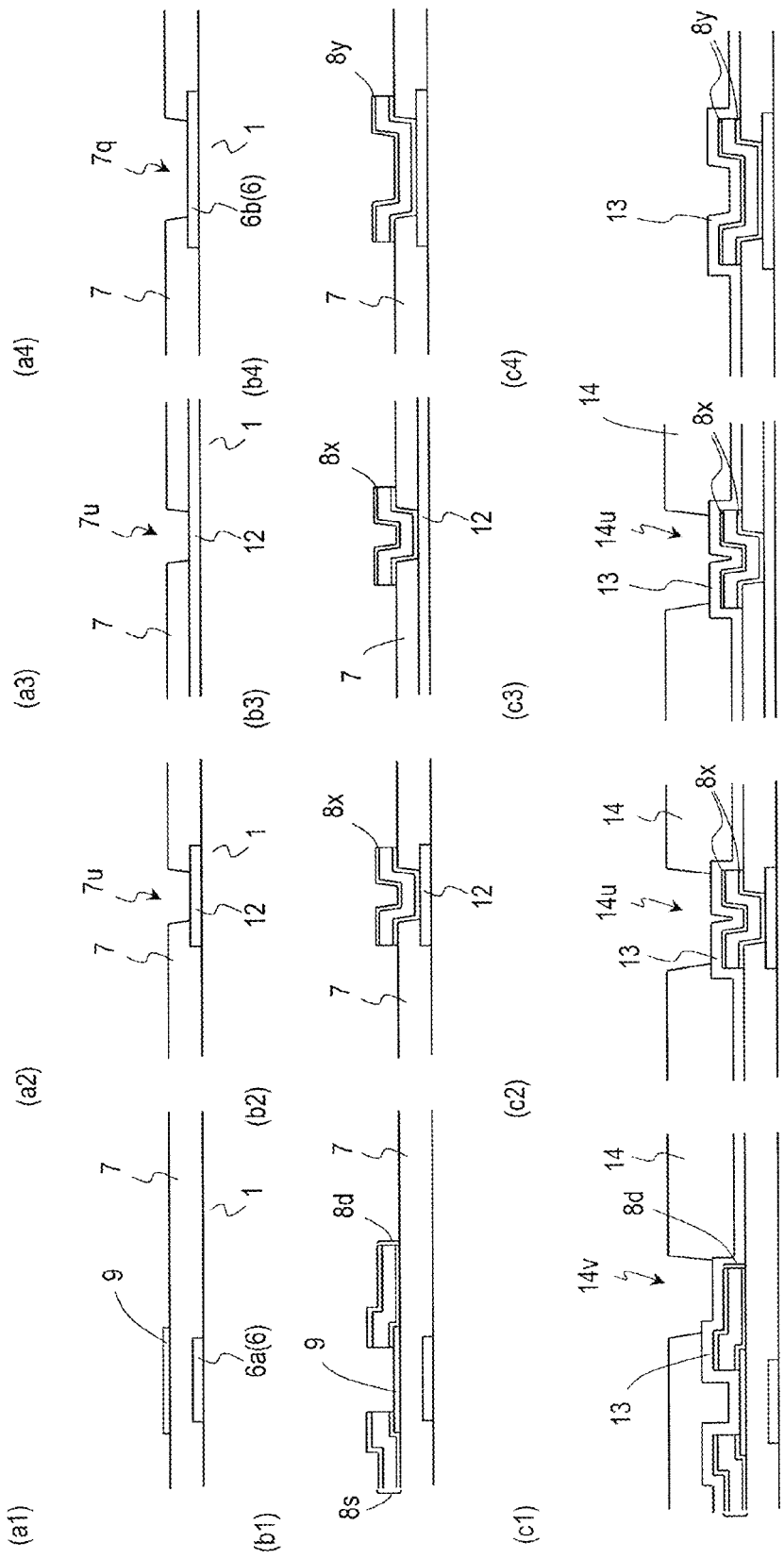
FIG. 12 (a1) through (c1) are schematic cross-sectional views illustrating respective manufacturing process steps to make the TFT 100D, (a2) through (c2) and (a3) through (c3) are schematic cross-sectional views illustrating respective process steps to form the storage capacitor connecting portion 200D. And (a4) through (c4) are schematic cross-sectional views illustrating respective process steps to form the gate terminal portion 300D.
Figure 13:
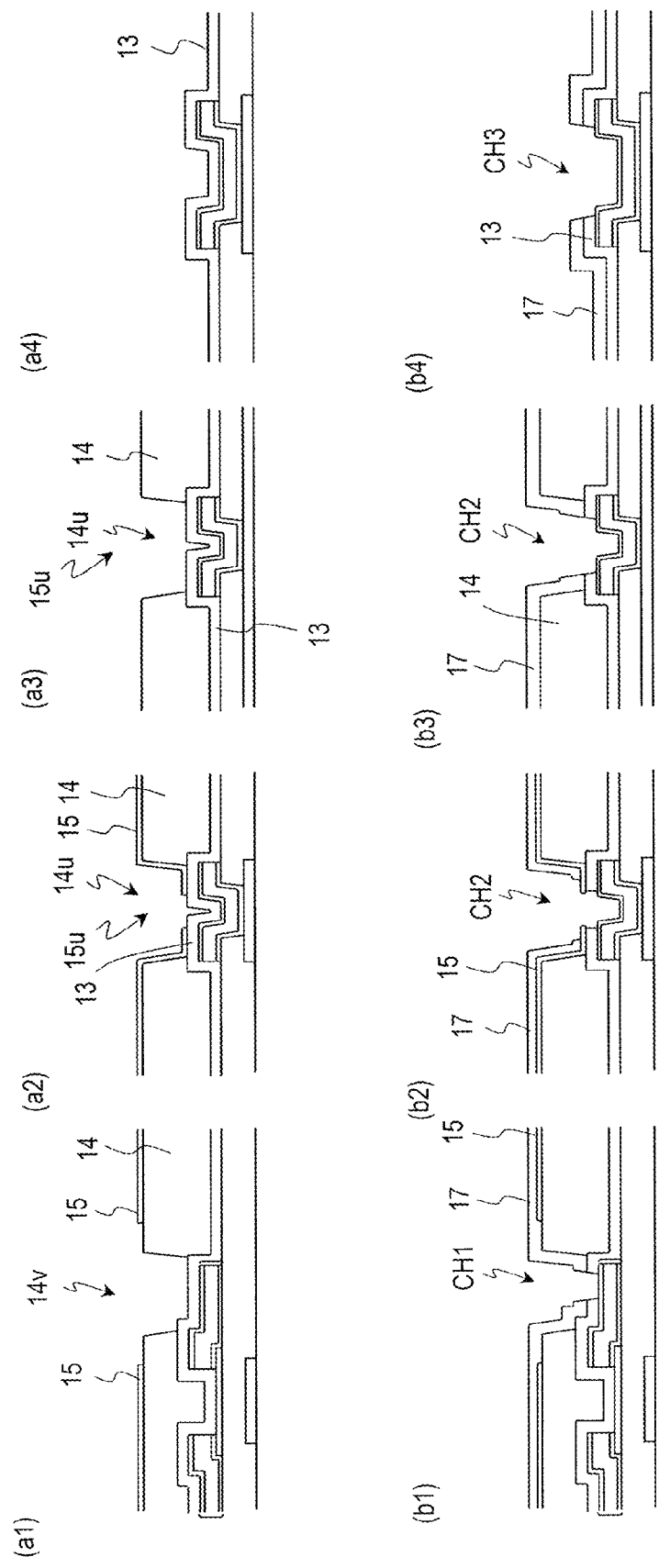
FIG. 13 (a1) and (b1) are schematic cross-sectional views illustrating respective manufacturing process steps to make the TFT 100D, (a2), (b2), (a3) and (b3) are schematic cross-sectional views illustrating respective process steps to form the storage capacitor connecting portion 200D. And (a4) and (b4) are schematic cross-sectional views illustrating respective process steps to form the gate terminal portion 300D.

Thereafter, as shown in portion (a1) of FIG. 12, an oxide semiconductor layer 9 is formed by the method described above to overlap with the gate electrode 6a when viewed along a normal to the substrate 1.

Subsequently, as shown in portions (b1) to (b4) of FIG. 12, a source electrode 8s, a drain electrode 8d, a first connecting layer 8x and a third connecting layer 8y are formed out of the same conductive film by a known method. As shown in portion (b1) of FIG. 12, the source and drain electrodes 8s and 8d are formed to be electrically connected to the oxide semiconductor layer 9. Meanwhile, as shown in portions (b2) and (b3) of FIG. 12, a first connecting layer 8x is formed so as to cover the side surface of the hole 7u at least partially. Also, the first connecting layer 8x is formed so as to cover the storage capacitor line 12 inside the hole 7u and is electrically connected to the storage capacitor line 12. In the same way, as shown in portion (b4) of FIG. 12, a third connecting layer 8y is formed so as to cover the side surface of the hole 7q at least partially. Also, the third connecting layer 8y is formed so as to cover the gate terminal connecting layer 6b inside the hole 11q and is electrically connected to the gate line 6. By providing the first and third connecting layers 8x and 8y, the storage capacitor line and gate terminal connecting layer 6b which are exposed inside the holes 11u and 11q can be protected and can be prevented from being disconnected during an etching process.

Next, as shown in portions (c1) to (c4) of FIG. 12, a protective layer 13 is formed by CVD process, for example, over the source and drain electrodes 8s and 8d, and an organic insulating layer 14 with holes 14v and 14u is formed on the protective layer 13 by photolithographic process. The hole 14v is created to overlap with the drain electrode 8d when viewed along a normal to the substrate 1. On the other hand, the hole 14u is created to overlap with the first connecting layer 8x when viewed along a normal to the substrate 1. Meanwhile, in the region illustrated in portion (c4) of FIG. 12, the organic insulating layer 14 is not formed but the protective layer 13 is exposed.

Thereafter, as shown in portions (a1) to (a4) of FIG. 13, a first transparent electrode 15 is formed on the organic insulating layer 14 by sputtering process, for example. In the region shown in portion (a2) of FIG. 13 where the storage capacitor connecting portion 200D is going to be formed, the first transparent electrode 15 is formed so as to cover the side surface of the hole 14u at least partially. However, in the region shown in portion (a1) of FIG. 13, the first transparent electrode 15 is formed so as not to cover the side surface of the hole 14v. And in the region shown in portion (a4) of FIG. 13, the first transparent electrode 15 is not formed. A hole 15u is cut through the first transparent electrode 15 so as to overlap with the first connecting layer 8x when viewed along a normal to the substrate 1. Also, since a portion of the first transparent electrode 15 which overlaps with the first connecting layer 8x is formed to have a symmetric shape, the area of contact between the first and second transparent electrodes 15 and 19 does not change even if misalignment has occurred.

Next, although not shown, a dielectric film (insulating film) is formed over the first transparent electrode 15 and the protective layer 13 by CVD process, for example.

Thereafter, as shown in portion (b1) to (b4) of FIG. 13, a dielectric layer 17 with contact holes (holes) CH1 to CH3 is formed by selectively etching the dielectric film and the protective layer 13 simultaneously.

These contact holes CH1, CH2 and CH3 are created so as to partially expose the drain electrode 8d, the first connecting layer 8x and the third connecting layer 8y, respectively. Since the contact holes CH1 to CH3 can be created with a single photomask by etching the dielectric film and the protective layer 13 simultaneously in this manner, the manufacturing cost can be cut down. In addition, these contact holes CH1 to CH3 can be created without using multiple photomasks.

The dielectric layer 17 is formed so as to cover the side surface of the holes 14v and 14u at least partially and to expose at least partially the first transparent electrode 15 inside the contact hole CH2.

Next, as shown in FIGS. 11(a) to 11(d), a second transparent electrode 19, a second connecting layer 19a and a transparent electrode 19b are formed out of the same transparent conductive film on the dielectric layer 17 by sputtering process, for example. The second transparent electrode 19, second connecting layer 19a and transparent electrode 19b are not electrically connected together.

The second transparent electrode 19 is electrically connected to the drain electrode 8d inside the contact hole CH1. The second connecting layer 19a is electrically connected to the first transparent electrode 15 and the first connecting layer 8x inside the contact hole CH2. As a result, the first transparent electrode 15 is electrically connected to the storage capacitor line 12 via the second connecting layer 19a. The transparent electrode 19b is electrically connected to the third connecting layer 8y inside the contact hole CH3.

Figure 14:
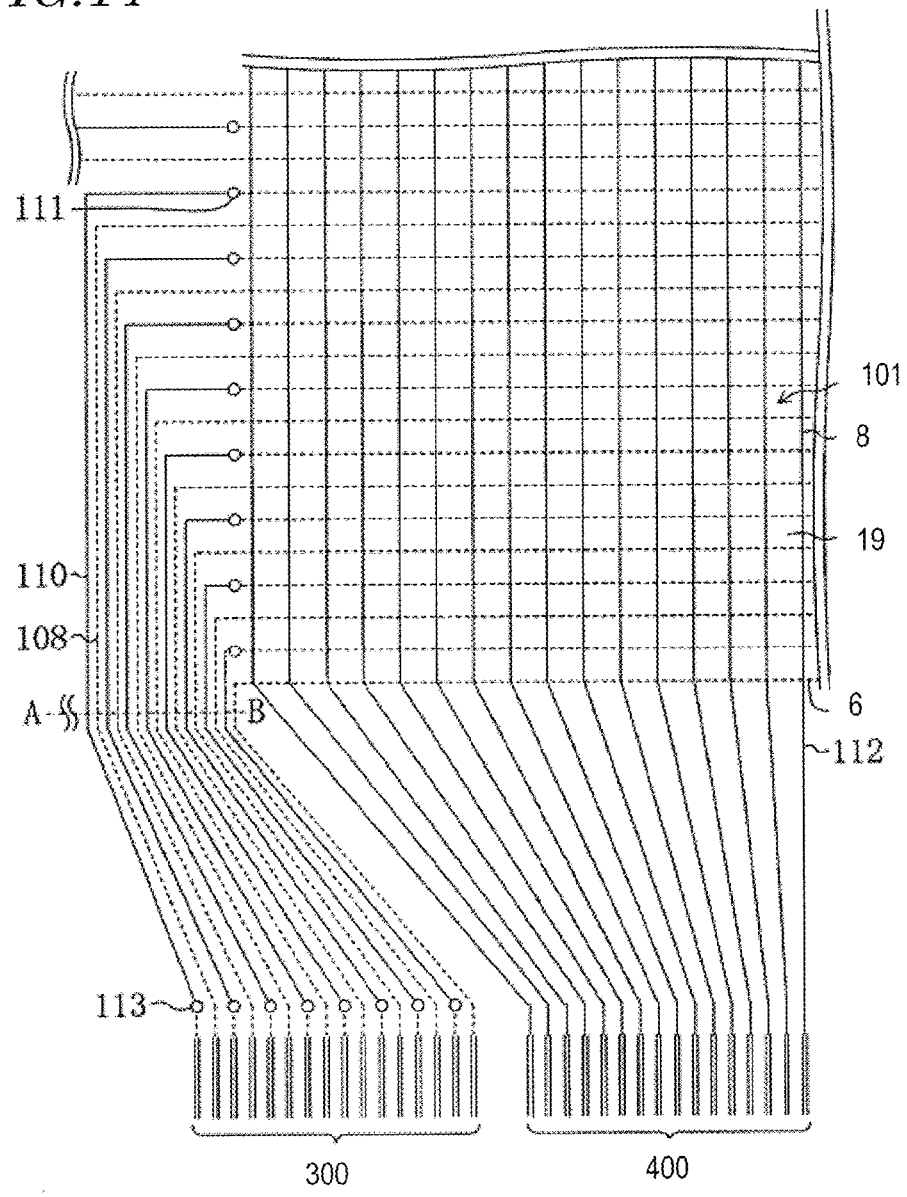
FIG. 14 A schematic plan view of a TFT substrate illustrating an arrangement of lines.
Figure 15:
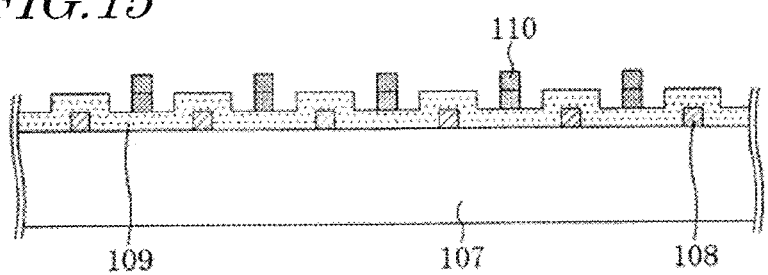
FIG. 15 A schematic cross-sectional view as viewed on the plane A-B shown in FIG. 14.
Figure 16:
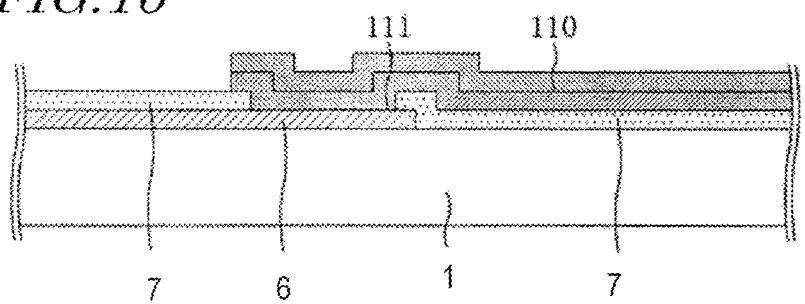
FIG. 16 A schematic cross-sectional view of the arrangement of lines shown in FIG. 14 in the vicinity of a contact hole 111.

Next, an arrangement of lines (including source lines and gate lines) will be described with reference to FIGS. 14 to 16. FIG. 14 is a schematic plan view illustrating an arrangement of lines. FIG. 15 is a schematic cross-sectional view as viewed on the plane A-B shown in FIG. 14. And FIG. 16 is a schematic cross-sectional view of the arrangement of lines shown in FIG. 14 in the vicinity of the contact hole 111.

The TFT substrates 1000A to 1000D described above may have the arrangement of lines disclosed in PCT International Application Publication No. 2005/029450, for example, the entire disclosure of which is hereby incorporated by reference.

Hereinafter, part of the arrangement of lines disclosed in PCT International Application Publication No. 2005/029450 will be described briefly.

The TFT substrate with the arrangement of lines shown in FIG. 14 includes a plurality of gate lines 6 which have been formed on the substrate 1, an insulating layer 7 which covers those gate lines 6, and a plurality of source lines 8 which have been formed on the insulating layer 7 and which intersect with those gate lines 6. A plurality of TFTs (not shown in FIG. 14) have been formed and are each arranged in the vicinity of the intersection between associated ones of the gate lines 6 and source lines 8. Each of those TFTs is electrically connected to an associated pixel electrode (second transparent electrode) 19. Those pixel electrodes 19 have been formed in a display area 101. The TFT substrate further includes: a plurality of gate terminals 300 which are arranged around the display area 101 (e.g., under the display area 101 in FIG. 14) to input signals to those gate lines 6; a plurality of source terminals 400 which are arranged around the display area 101 (e.g., under the display area 101 in FIG. 14) to input signals to those source lines 8; a plurality of extended gate lines 108 and 110 which are arranged around the display area 101 (e.g., on the left hand side of, and under, the display area 101 in FIG. 14) to extend those gate lines 6 to their associated gate terminals 300; and a plurality of extended source lines 112 which are arranged around the display area 101 (e.g., under the display area 101 in FIG. 14) to extend those source lines 8 to their associated source terminals 400.

The gate terminals 300 and source terminals 400 are arranged in the vicinity of any one side of the display area 101 (e.g., along one side under the display area 101 in this embodiment). By arranging these terminals 300 and 400 in the vicinity of any one side of the display area 101 in this manner, the peripheral areas on the right- and left-hand sides of the display area 101 are not occupied by those terminals 300 and 400, and therefore, can have their planar area reduced. As a result, the frame area can be narrowed.

Each of those extended gate lines 108 and 110 is comprised of an extended line 108 which is formed out of the same conductive film as the gate line 6 and an extended line 110 which is formed out of the same conductive film as the source line 8 on the gate insulating layer 7 which covers the extended line 108. Also, as shown in FIGS. 14 and 15, on a plan view, those extended lines 108 and 110 are arranged alternately without overlapping with each other. The extended line 110 formed on the gate insulating layer 7 is electrically connected to the gate line 6 and the gate terminal 300 through contact holes 111 and 113 which have been cut through the gate insulating layer 7. As shown in FIG. 16, the gate line 6 is changed into an extended line on a different layer via the contact hole 111. Such a change is made in the same way via the contact hole 113, too.

Such an arrangement of lines may be adopted for the TFT substrates 1000A to 1000D described above.

Figure 17:
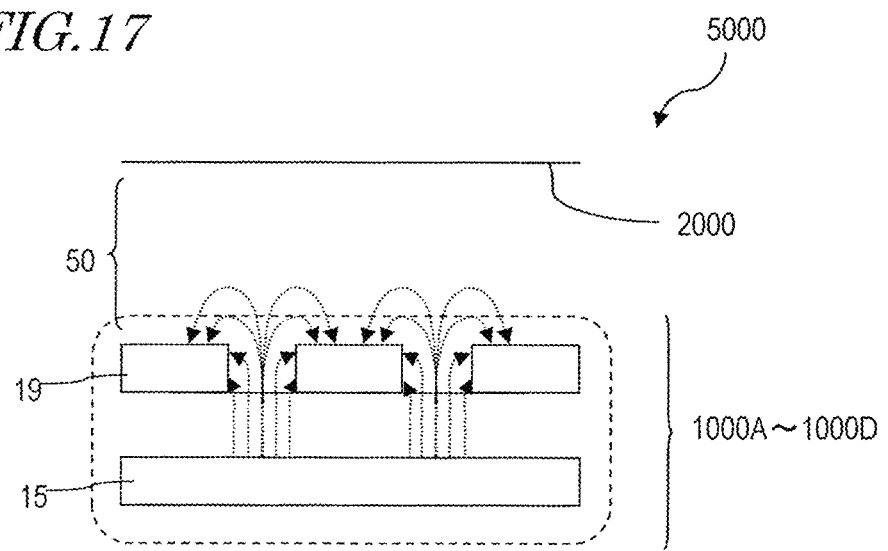
FIG. 17 A schematic cross-sectional view of a display device 5000 as an embodiment of the present invention.
Figure 18:
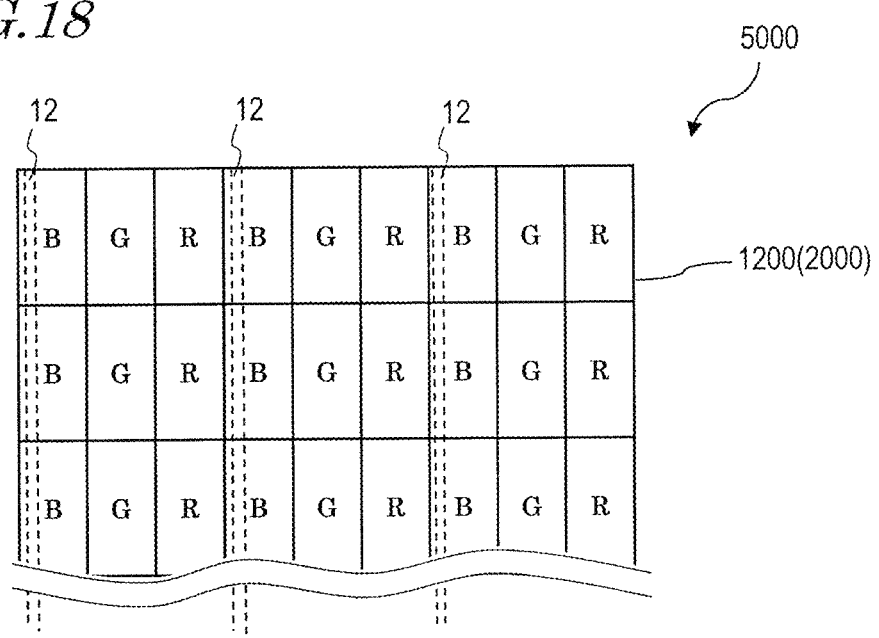
FIG. 18 A schematic plan view of the display device 5000 illustrating a relative arrangement of the storage capacitor lines 12 and blue color filters B.

Hereinafter, a display device 5000 as an embodiment of the present invention, including any of the TFT substrates 1000A to 1000D described above, will be described with reference to FIGS. 17 and 18. FIG. 17 is a schematic cross-sectional view of a liquid crystal display device 500 including any of the TFT substrates 1000A to 1000D described above. In FIG. 17, the dotted arrows indicate the directions of an electric field. FIG. 18 is a schematic plan view illustrating a relative arrangement of the storage capacitor lines 12 and a color filter layer 1200.

As shown in FIG. 17, this display device 5000 includes any of the TFT substrates 1000A to 1000D, a counter substrate 2000 which is arranged to face the TFT substrate 1000A to 1000D, and a liquid crystal layer 50 which is interposed between the counter substrate 2000 and the TFT substrate 1000A to 1000D. The TFT substrate 1000A to 1000D has a plurality of pixels and the second transparent electrode 19 is divided into multiple portions which are provided for the respective pixels and which function as pixel electrodes.

The second transparent electrode 19 suitably has multiple slit holes within each pixel, and the first transparent electrode 15 is suitably present at least under those holes and functions as a common electrode.

The display device 5000 may be an FFS (Fringe Field Switching) mode liquid crystal display device, for example. Such a display device 5000 is disclosed in Japanese Laid-Open Patent Publication No. 2011-53443, the entire disclosure of which is hereby incorporated by reference.

FIG. 18 is a schematic plan view illustrating a relative arrangement of the storage capacitor lines 12 and a color filter layer 1200. In FIG. 18, illustration of every component of the display device 5000 but the color filter layer 1200 and the storage capacitor lines 12 is omitted for the sake of simplicity.

As shown in FIG. 18, the display device 5000 includes the TFT substrate 1000A described above and a counter substrate 2000 including the color filter layer 1200. The color filter layer 1200 includes at least blue color filters B, and typically includes blue color filters B, red color filters R and green color filters G. The storage capacitor lines 12 are suitably arranged on the substrate 1 to face the blue color filters B. If the storage capacitor lines 12 are arranged in this manner, then the contact holes CH2 of the storage capacitor connecting portions 200A to 200D are arranged to face the blue color filters B. If the contact holes CH2 of the storage capacitor connecting portions 200A to 200D are arranged to face the blue color filters B, a significant decline in display quality can be avoided even if the pixel aperture ratio has decreased due to some increase in the size of the contact holes CH2, because the color blue affects the display quality (in terms of luminance and contrast ratio) to a lesser degree even if the pixel aperture ratio has decreased to a certain degree.

INDUSTRIAL APPLICABILITY

Embodiments of the present invention are broadly applicable to any semiconductor device including a thin-film transistor on a substrate. Among other things, embodiments of the present invention are particularly effectively applicable to a semiconductor device including a thin-film transistor (such as an active-matrix substrate) and a display device including such a semiconductor device.

REFERENCE SIGNS LIST

1 substrate
6 gate line
6a gate electrode
8s source electrode
8d drain electrode
8y connecting layer
9 oxide semiconductor layer
11v, 11q hole
12 storage capacitor line
15, 19 transparent electrode
CH1, CH2, CH3 contact hole
1000A semiconductor device

The invention claimed is:

1. A semiconductor device comprising a substrate and a thin-film transistor formed on the substrate,
the thin-film transistor including: a gate electrode; a gate insulating layer formed over the gate electrode; an oxide semiconductor layer formed on the gate insulating layer; and
source and drain electrodes electrically connected to the oxide semiconductor layer,
wherein the semiconductor device further includes:
an interlayer insulating layer including a protective layer which contacts with the source and drain electrodes;
a first transparent electrode formed on the interlayer insulating layer;
a dielectric layer formed over the first transparent electrode;
a second transparent electrode arranged on the dielectric layer so as to overlap with at least a portion of the first transparent electrode with the dielectric layer interposed between them;
a storage capacitor line formed out of the same conductive film as the gate electrode;
a first connecting layer which is electrically connected to the storage capacitor line and which is formed out of the same conductive film as the source or drain electrode; and
a second connecting layer which is formed out of the same conductive film as, but which is not electrically connected to, the second transparent electrode,
an insulating layer interposed between the first and second connecting layers has a contact hole to electrically connect the second connecting layer to the first transparent electrode and the first connecting layer,
when viewed along a normal to the substrate, the second connecting layer and the contact hole overlap at least partially with the first connecting layer,
the first transparent electrode includes a portion which overlaps with the first connecting layer when viewed along a normal to the substrate,
the portion which overlaps with the first connecting layer has a point symmetric shape of which a point of symmetry is located inside the contact hole when viewed along a normal to the substrate,
the first transparent electrode is not in direct contact with the first connecting layer,
a portion of the first transparent electrode is in direct contact with the second connecting layer,
the first connecting layer is in direct contact with the second connecting layer, and
the first transparent electrode is electrically connected to the storage capacitor line via the first and second connecting layers.

2. The semiconductor device of claim 1, wherein the second connecting layer covers at least partially a side surface of the contact hole.

3. The semiconductor device of claim 1, wherein in a first cross section which intersects with the substrate at right angles and which includes the point of symmetry, a portion of the first transparent electrode is in contact with the second connecting layer, and
in a second cross section which intersects with the substrate at right angles, which includes the point of symmetry and which is different from the first cross section, the first transparent electrode is out of contact with the second connecting layer.

4. The semiconductor device of claim 1, wherein the contact hole includes a first hole formed in the protective layer and a second hole formed in the dielectric layer, and
a side surface of the second hole is at least partially aligned with a side surface of the first hole.

5. The semiconductor device of claim 4, wherein the interlayer insulating layer further includes an organic insulating layer,
the organic insulating layer has a third hole which overlaps with the first connecting layer when viewed along a normal to the substrate, and
the first and second holes are located at least partially inside the third hole.

6. The semiconductor device of claim 5, wherein the first transparent electrode covers a side surface of the third hole at least partially.

7. The semiconductor device of claim 1, further comprising an etch stop layer formed so as to cover a channel region of the oxide semiconductor layer,
wherein the gate insulating layer is formed over the storage capacitor line,
the etch stop layer is formed over the gate insulating layer, the gate insulating layer and the etch stop layer have a fourth hole which overlaps with the storage capacitor line when viewed along a normal to the substrate, inside the fourth hole, a side surface of the gate insulating layer is aligned at least partially with a side surface of the etch stop layer, and the first connecting layer covers the respective side surfaces of the gate insulating layer and the etch stop layer at least partially inside the fourth hole.

8. The semiconductor device of claim 1, further comprising a gate terminal portion formed on the substrate, wherein the gate terminal portion includes:

a gate terminal connecting layer formed out of the same conductive film as the gate electrode; and a third connecting layer which is electrically connected to the gate terminal connecting layer and which is formed out of the same conductive film as the source or drain electrode, the gate insulating layer is formed over the gate terminal connecting layer, the gate insulating layer and the etch stop layer have a fifth hole which overlaps with the gate terminal connecting layer when viewed along a normal to the substrate, and the third connecting layer covers at least partially a side surface of the fifth hole.

9. The semiconductor device of claim 1, comprising an In—Ga—Zn—O based semiconductor.

10. A display device comprising:

the semiconductor device of claim 1;

a counter substrate which is arranged to face the semiconductor device and which includes at least a blue color filter;

a liquid crystal layer interposed between the counter substrate and the semiconductor device; and a plurality of pixels, wherein the second transparent electrode is divided into a plurality of portions which are provided for the respective pixels and which function as pixel electrodes, and the storage capacitor line is arranged so as to face the blue color filter.

11. The display device of claim 10, wherein the second transparent electrode has a plurality of slit holes inside the pixels, and the first transparent electrode is present at least under the plurality of holes and functions as a common electrode.

12. The display device of claim 10, wherein the semiconductor device includes an In—Ga—Zn—O based semiconductor.

* * * * *